US012684835B2

(12) United States Patent
Hsu et al.

(10) Patent No.: US 12,684,835 B2
(45) Date of Patent: Jul. 14, 2026

(54) STRUCTURE AND FORMATION METHOD OF SEMICONDUCTOR DEVICE WITH CONDUCTIVE CONTACT

(71) Applicant: Taiwan Semiconductor Manufacturing Company, Ltd., Hsinchu (TW)

(72) Inventors: Chu-Yuan Hsu, Taichung City (TW); Jia-Chuan You, Taoyuan City (TW); Chia-Hao Chang, Hsinchu City (TW); Kuo-Cheng Chiang, Zhubei City (TW); I-Han Huang, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 405 days.

(21) Appl. No.: 18/446,624

(22) Filed: Aug. 9, 2023

(65) Prior Publication Data

US 2025/0056848 A1    Feb. 13, 2025

(51) Int. Cl.
| | |
|---|---|
| *H10D 64/01* | (2025.01) |
| *H10D 30/00* | (2025.01) |
| *H10D 30/01* | (2025.01) |
| *H10D 62/10* | (2025.01) |
| *H10D 62/13* | (2025.01) |

(Continued)

(52) U.S. Cl.
CPC ......... *H10D 62/121* (2025.01); *H10D 30/019* (2025.01); *H10D 30/501* (2025.01); *H10D 62/151* (2025.01); *H10D 64/017* (2025.01); *H10D 64/256* (2025.01); *H10D 84/0133* (2025.01); *H10D 84/0149* (2025.01); *H10D 84/832* (2025.01)

(58) Field of Classification Search
CPC .. H10D 62/121; H10D 30/019; H10D 30/501; H10D 62/151; H10D 64/017; H10D 64/256; H10D 84/0133; H10D 84/0149; H10D 84/832; H01L 29/0673; H01L 29/42392; H01L 29/66439; H01L 29/66545; H01L 29/775; H01L 29/78696; H01L 21/823807; H01L 27/092
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

*Primary Examiner* — Earl N Taylor
(74) *Attorney, Agent, or Firm* — McClure, Qualey & Rodack, LLP

(57) ABSTRACT

A semiconductor device structure and a method for forming a semiconductor device structure are provided. The method includes forming a metal gate stack wrapped around multiple semiconductor nanostructures. The semiconductor nanostructures are beside an epitaxial structure. The method includes forming a dielectric layer over the metal gate stack and the epitaxial structure. The method further includes forming a contact opening in the dielectric layer and forming a protective layer over sidewalls of the contact opening. In addition, the method includes deepening the contact opening so that the contact opening extends into the epitaxial structure after the formation of the protective layer. The method includes forming a conductive contact filling the contact opening.

20 Claims, 27 Drawing Sheets

(51) Int. Cl.
    *H10D 64/23*       (2025.01)
    *H10D 84/01*       (2026.01)
    *H10D 84/83*       (2025.01)

(56)             References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,978,773 B2 * | 5/2024 | Su | H10D 30/6729 |
| 2021/0134795 A1 * | 5/2021 | Ju | H10D 64/017 |
| 2021/0359125 A1 * | 11/2021 | Liang | H10D 30/62 |
| 2021/0399109 A1 * | 12/2021 | Su | H10D 30/6737 |
| 2021/0408246 A1 * | 12/2021 | Ganguly | H10D 30/6729 |
| 2022/0037491 A1 * | 2/2022 | You | H10D 84/83 |
| 2022/0165856 A1 * | 5/2022 | Yu | H10D 30/6729 |
| 2022/0416035 A1 * | 12/2022 | Chu | H10D 30/6729 |
| 2023/0010717 A1 * | 1/2023 | Wang | H10D 30/014 |
| 2023/0033570 A1 * | 2/2023 | Wu | H10D 30/6735 |
| 2023/0369131 A1 * | 11/2023 | Chang | H10D 30/6735 |
| 2024/0021708 A1 * | 1/2024 | Lan | H10D 30/024 |

* cited by examiner

STRUCTURE AND FORMATION METHOD OF SEMICONDUCTOR DEVICE WITH CONDUCTIVE CONTACT

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
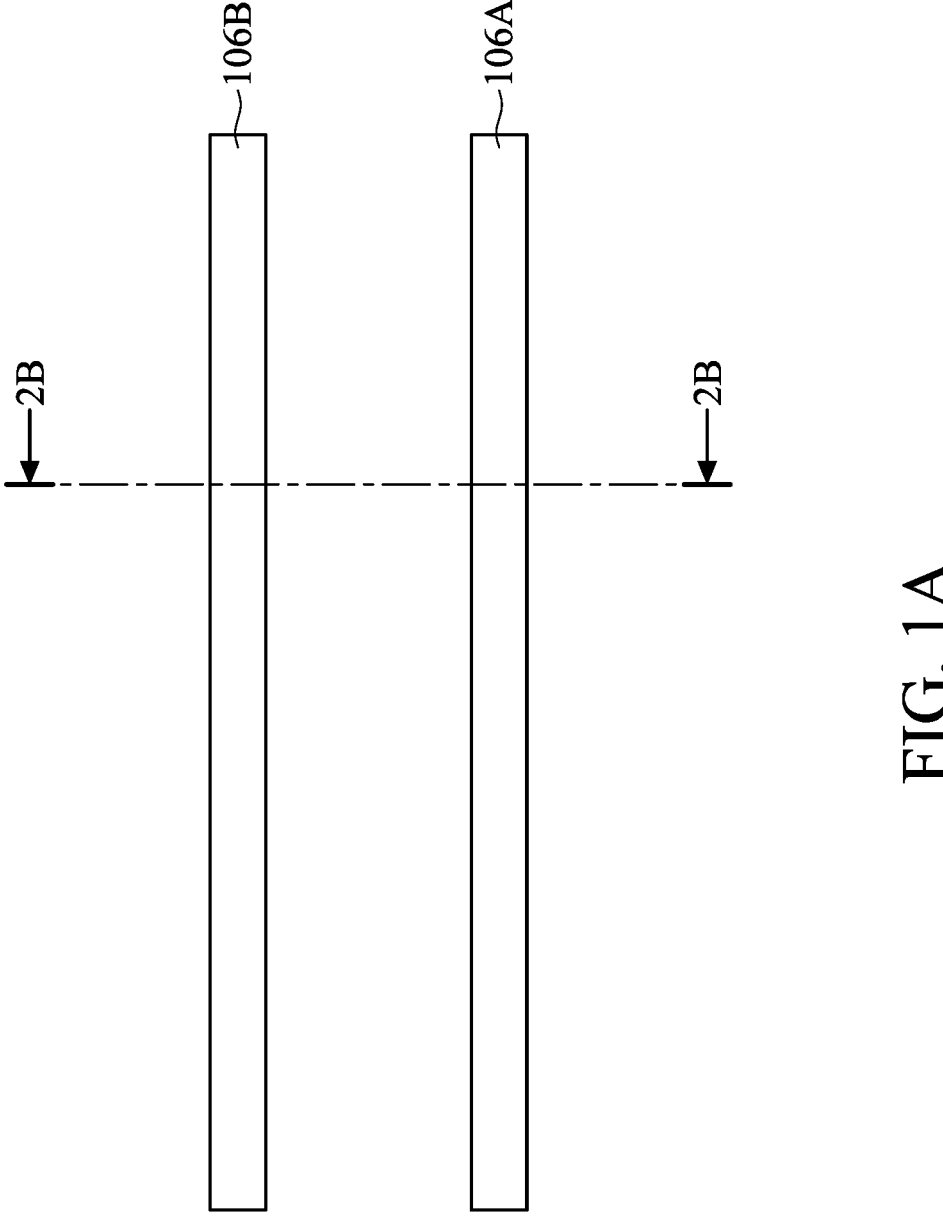
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using another applicable process.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
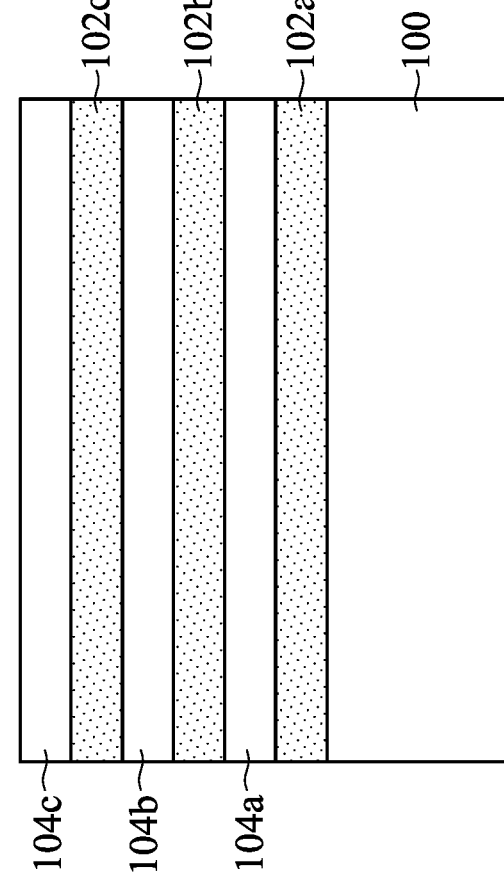
FIGS. 2A-2D are cross-sectional views of various stages of a process for forming a portion of a semiconductor device structure, in accordance with some embodiments.

FIGS. 2A-2D are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, another suitable material, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, and 102c. The semiconductor stack also includes multiple semiconductor layers 104a, 104b, and 104c. In some embodiments, the semiconductor layers 102a-102c and the semiconductor layers 104a-104c are laid out in an alternating manner, as shown in FIG. 2A.

In some embodiments, the semiconductor layers 102a-102c function as sacrificial layers that will be removed in a subsequent process to release the semiconductor layers 104a-104c. The semiconductor layers 104a-104c that are released may function as channel structures of one or more transistors.

In some embodiments, the semiconductor layers 104a-104c that will be used to form channel structures are made of a material that is different than that of the semiconductor layers 102a-102c. In some embodiments, the semiconductor layers 104a-104c are made of or include silicon, germanium, another suitable material, or a combination thereof. In some embodiments, the semiconductor layers 102a-102c are made of or include silicon germanium. In some other embodiments, the semiconductor layers 104a-104c are made of silicon germanium, and the semiconductor layers 102a-102c are made of silicon germanium with different atomic concentration of germanium than that of the semiconductor layers 104a-104c. As a result, different etching selectivity and/or different oxidation rates during subsequent processing may be achieved between the semiconductor layers 102a-102c and the semiconductor layers 104a-104c.

The present disclosure contemplates that the semiconductor layers 102a-102c and the semiconductor layers 104a-104c include any combination of semiconductor materials that can provide desired etching selectivity, desired oxidation rate differences, and/or desired performance characteristics.

In some embodiments, the semiconductor layers 102a-102c and 104a-104c are formed using multiple epitaxial growth operations. Each of the semiconductor layers 102a-102c and 104a-104c may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, another applicable process, or a combination thereof.

In some embodiments, the semiconductor layers 102a-102c and 104a-104c are grown in-situ in the same process chamber. In some embodiments, the growth of the semiconductor layers 102a-102c and 104a-104c are alternately and sequentially performed in the same process chamber to complete the formation of the semiconductor stack. In some embodiments, the vacuum of the process chamber is not broken before the epitaxial growth of the semiconductor layers 102a-102c and 104a-104c is accomplished.

Afterwards, hard mask elements are formed over the semiconductor stack to assist in a subsequent patterning of the semiconductor stack. One or more photolithography processes and one or more etching processes are used to pattern the semiconductor stack into multiple fin structures including fin structures 106A and 106B, as shown in FIG. 2B in accordance with some embodiments.

The fin structures 106A and 106B may be patterned by any suitable method. For example, the fin structures 106A and 106B may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Figure 2B:
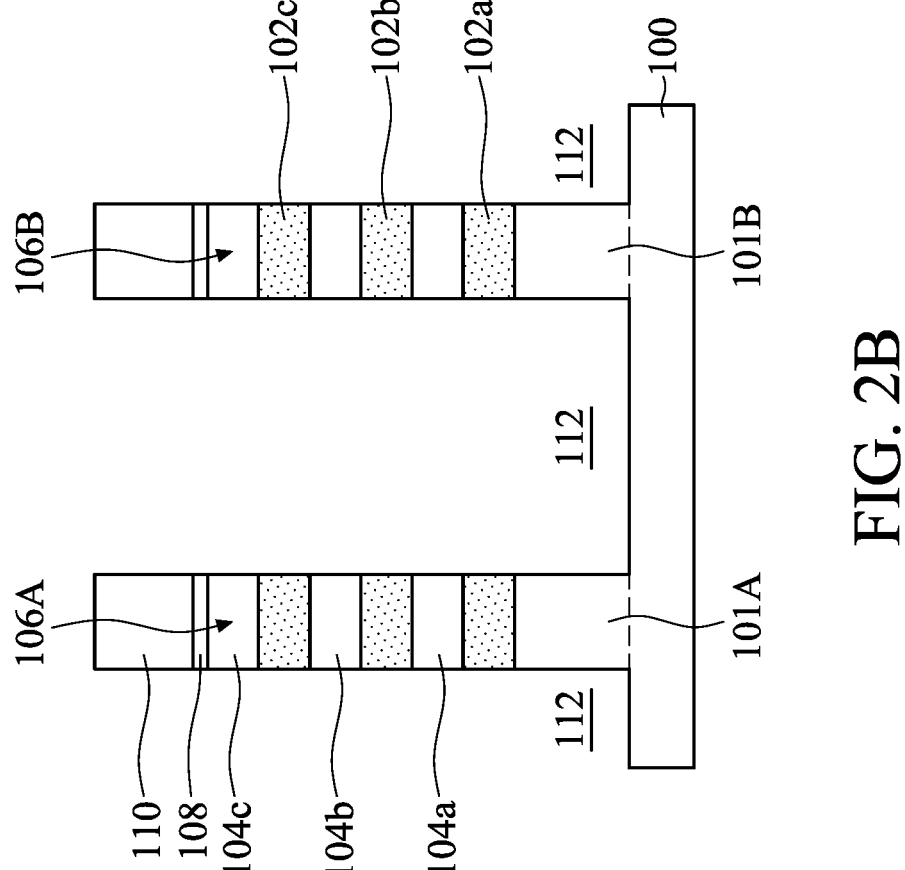

The semiconductor stack is partially removed to form trenches 112, as shown in FIG. 2B. Each of the fin structures 106A and 106B may include portions of the semiconductor layers 102a-102c and 104a-104c and semiconductor fins 101A and 101B. The semiconductor substrate 100 may also be partially removed during the etching process that forms the fin structures 106A and 106B. Protruding portions of the semiconductor substrate 100 that remain form the semiconductor fins 101A and 101B. Each of the semiconductor fins 101A and 101B may have a height that is within a range from about 35 nm to about 55 nm.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104c. The first mask layer 108 may be made of silicon oxide, germanium oxide, silicon germanium oxide, another suitable material, or a combination thereof. The second layer 110 may be made of silicon nitride, silicon oxynitride, silicon carbide, another suitable material, or a combination thereof.

Figure 1B:
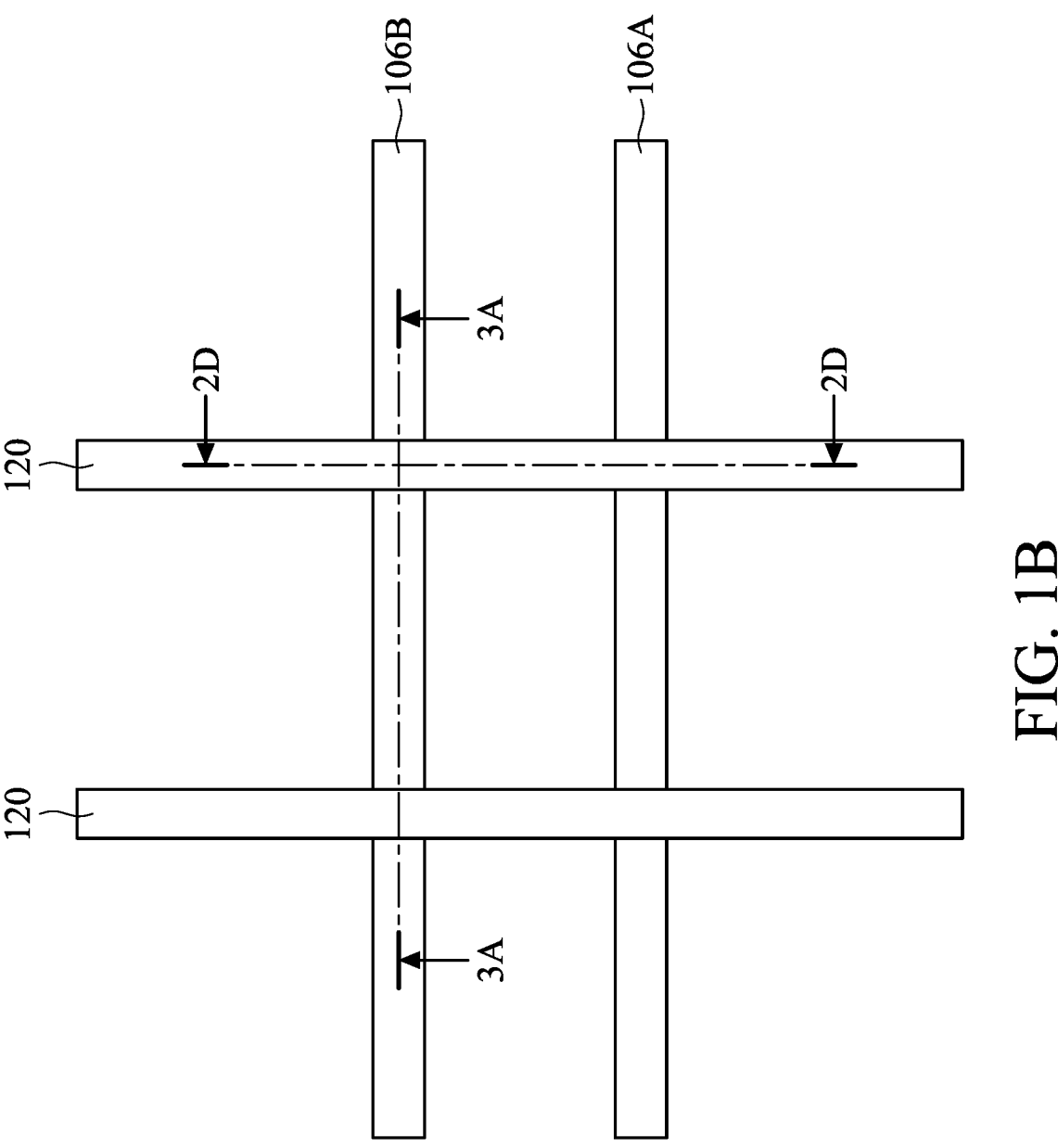

FIGS. 1A-1B are top views of various stages of a process for forming a portion of a semiconductor device structure, in accordance with some embodiments. In some embodiments, the fin structures 106A and 106B are oriented lengthwise. In some embodiments, the longitudinal extending directions of the fin structures 106A and 106B are substantially parallel to each other, as shown in FIG. 1A. In some embodiments, FIG. 2B is a cross-sectional view of the structure taken along the line 2B-2B in FIG. 1A.

Figure 2C:
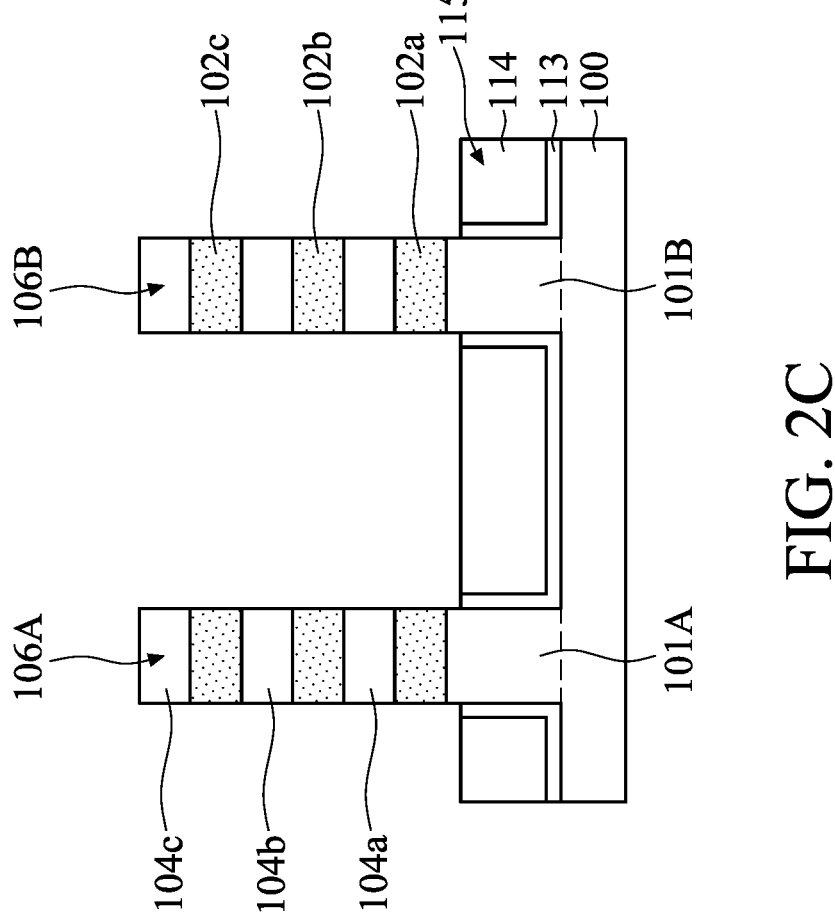

As shown in FIG. 2C, an isolation structure 115 is formed to surround lower portions of the fin structures 106A and 106B, in accordance with some embodiments. In some embodiments, the isolation structure 115 includes a dielectric filling 114 and a liner layer 113 that is adjacent to the semiconductor fins 101A and 101B. In some embodiments, the semiconductor fins 101A and 101B protrude from the top surface of the isolation structure 115.

In some embodiments, one or more dielectric layers are deposited over the fin structures 106A and 106B and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. The liner layer 113 may be made of or include silicon nitride, silicon oxynitride, silicon carbide, silicon oxycarbide, another suitable material, or a combination thereof. The dielectric layers and the liner layer 113 may be deposited using a flowable chemical vapor deposition (FCVD) process, an atomic layer deposition (ALD) process, a chemical vapor deposition (CVD) process, another applicable process, or a combination thereof.

Afterwards, a planarization process is used to partially remove the dielectric layers and the liner layer 113. The hard mask elements (including the first mask layer 108 and the second mask layer 110) may also function as stop layers of the planarization process. The planarization process may include a chemical mechanical polishing (CMP) process, a grinding process, a dry polishing process, an etching process, another applicable process, or a combination thereof.

Afterwards, one or more etching back processes are used to partially remove the dielectric layers and the liner layer 113. As a result, the remaining portion of the dielectric layers forms the dielectric filling 114 of the isolation structure 115. Upper portions of the fin structures 106A and 106B protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level. In some embodiments, the topmost surface of the isolation structure 115 is below the bottommost surface of the semiconductor layer 102a which functions as a sacrificial layer, as shown in FIG. 2C.

Afterwards, the remaining portions of the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
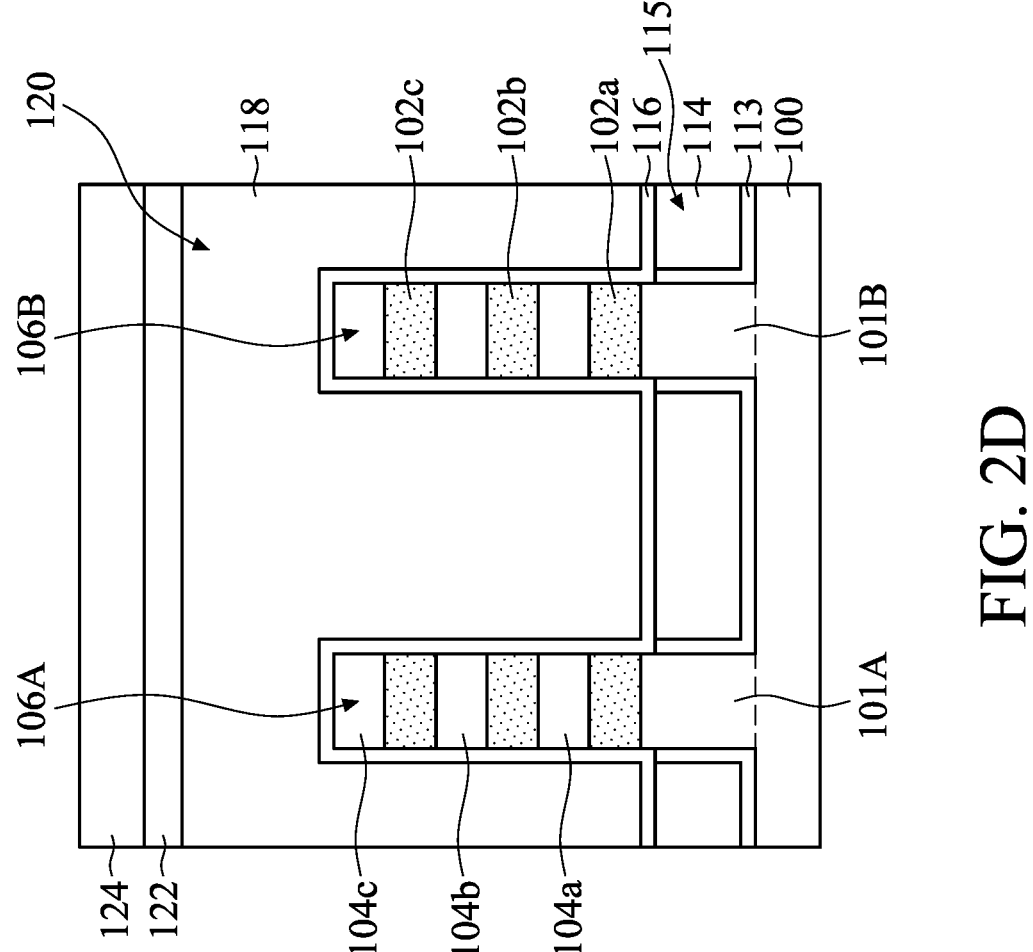
Figure 3A:
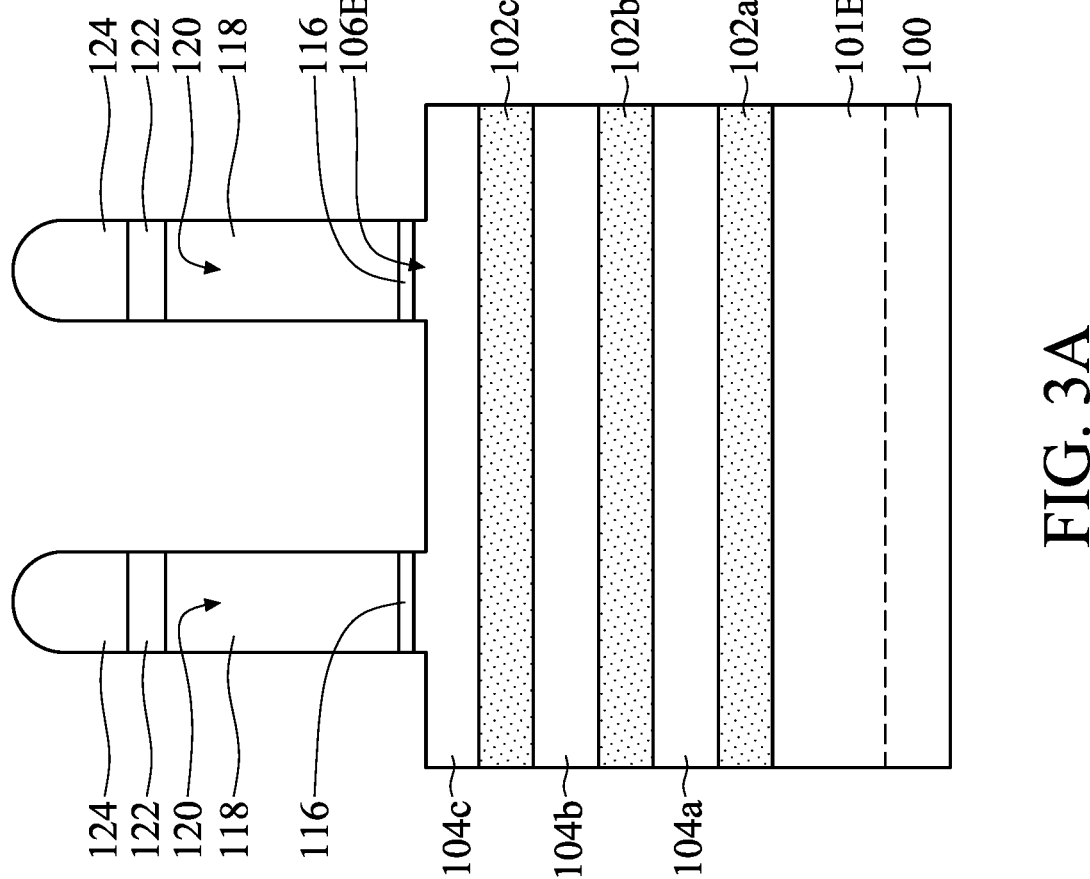
FIGS. 3A-3G are cross-sectional views of various stages of a process for forming a portion of a semiconductor device structure, in accordance with some embodiments.

Afterwards, dummy gate stacks 120 are formed to extend across the fin structures 106A and 106B, as shown in FIG. 1B in accordance with some embodiments. In some embodiments, FIG. 2D is a cross-sectional view of the structure taken along the line 2D-2D in FIG. 1B. FIGS. 3A-3G are cross-sectional views of various stages of a process for forming a portion of a semiconductor device structure, in accordance with some embodiments. In some embodiments, FIG. 3A is a cross-sectional view of the structure taken along the line 3A-3A in FIG. 1B.

As shown in FIGS. 1B, 2D, and 3A, the dummy gate stacks 120 are formed to partially cover and to extend across the fin structures 106A and 106B, in accordance with some embodiments. In some embodiments, the dummy gate stacks 120 are wrapped around portions of the fin structures 106A and 106B. As shown in FIG. 1B, other portions of the fin structures 106A and 106B are exposed without being covered by the dummy gate stacks 120.

As shown in FIGS. 2D and 3A, each of the dummy gate stacks 120 includes a dummy gate dielectric layer 116 and a dummy gate electrode 118. The dummy gate dielectric layers 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A and 106B. The dummy gate dielectric material layer may be deposited using an ALD process, a CVD process, another applicable process, or a combination thereof. The dummy gate electrode layer may be deposited using a CVD process. Afterwards, the dummy gate dielectric material layer and the dummy gate electrode layer are patterned to form the dummy gate stacks 120.

In some embodiments, hard mask elements including mask layers 122 and 124 are used to assist in the patterning process for forming the dummy gate stacks 120. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120 that include the dummy gate dielectric layers 116 and the dummy gate electrodes 118.

Figure 3B:
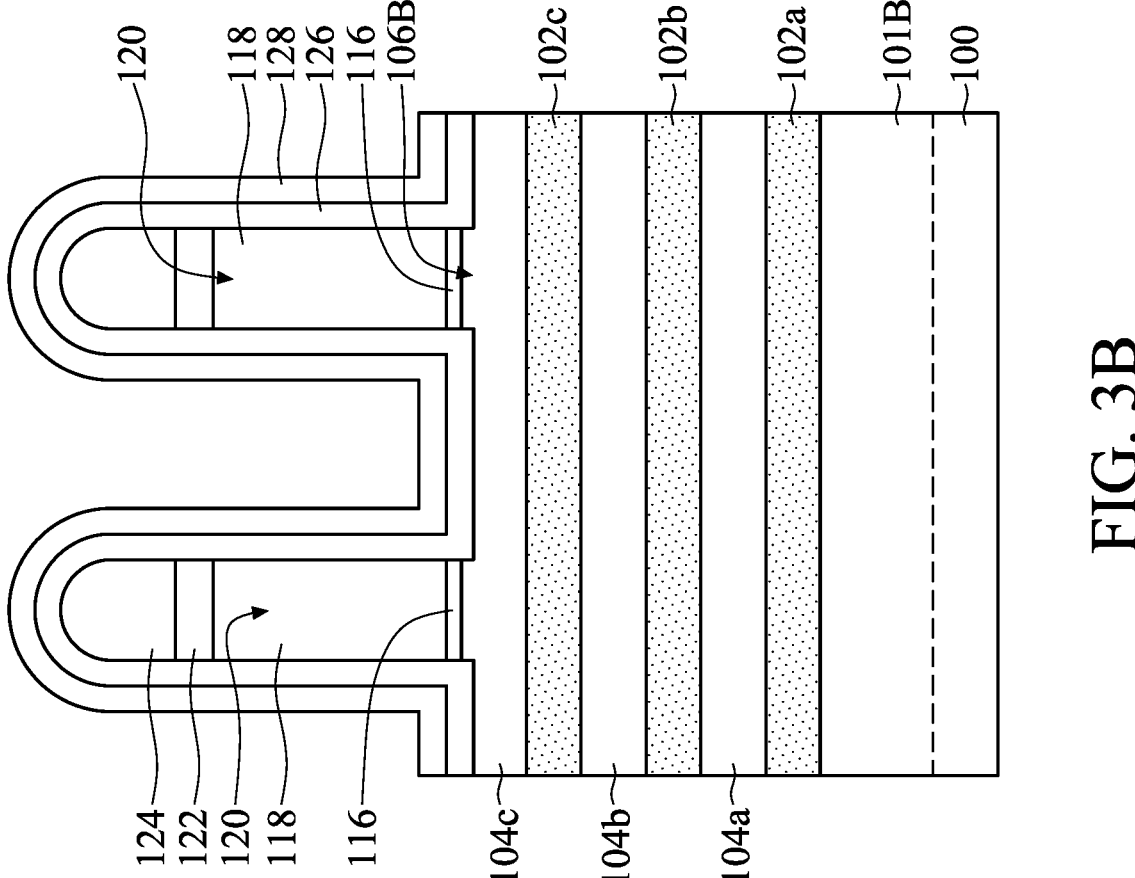

As shown in FIG. 3B, spacer layers 126 and 128 are afterwards deposited over the dummy gate stacks 120 and the fin structure 106B, in accordance with some embodiments. The spacer layers 126 and 128 extend along the tops and sidewalls of the dummy gate stacks 120, as shown in FIG. 3B. The spacer layers 126 and 128 also extend along the top of the fin structure 106B, as shown in FIG. 3B.

The spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, another suitable material, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, another suitable material, or a combination thereof. The spacer layers 126 and 128 may be sequentially deposited using a CVD process, an ALD process, a physical vapor deposition (PVD) process, another applicable process, or a combination thereof.

However, embodiments of the disclosure are not limited thereto. Many variations and/or modifications can be made to embodiments of the disclosure. In some other embodiments, the spacer layer 128 has a lower dielectric constant than that of the spacer layer 126.

Figure 3C:
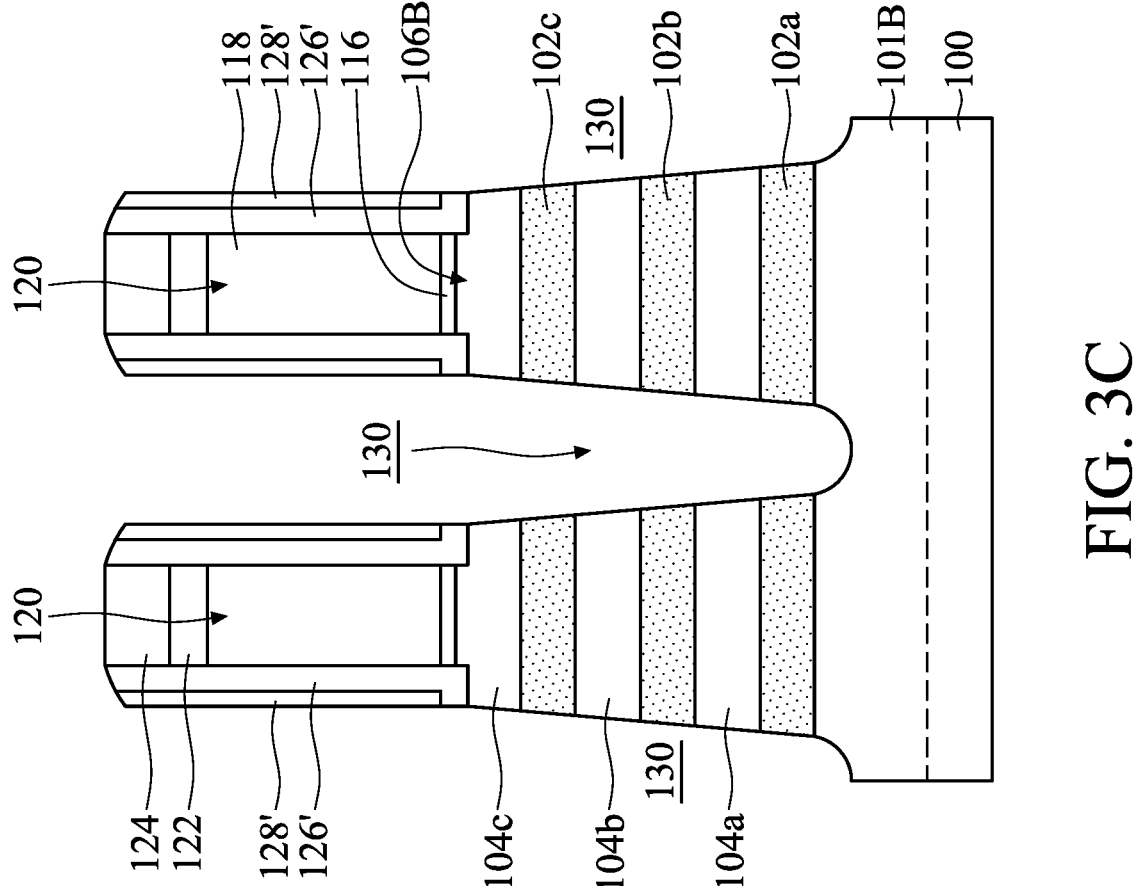

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120, as shown in FIG. 3C. The thickness of the spacer elements 126' and 128' may be within a range from about 4 nm to about 6 nm.

Afterwards, the fin structures 106A and 106B are partially removed to form recesses used for containing subsequently formed epitaxial structures. As shown in FIG. 3C, the fin structure 106B is partially removed to form recesses 130, in accordance with some embodiments. The recesses 130 expose the side surfaces of the semiconductor layers 104*a*-104*c* on which epitaxial structures (such as source/drain structures) will be formed later. Source/drain structures may refer to a source structure or a drain structure, individually or collectively dependent upon the context.

One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure 106B. In some embodiments, the recesses 130 further extend into the semiconductor fin 101B, as shown in FIG. 3C. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104*c*) is shorter than a lower semiconductor layer (such as the semiconductor layer 104*b*).

However, embodiments of the disclosure have many variations. In some other embodiments, the recesses 130 have substantially vertical sidewalls. In these cases, due to the profile of the recesses 130, an upper semiconductor layer (such as the semiconductor layer 104*c*) is substantially as wide as a lower semiconductor layer (such as the semiconductor layer 104*b*).

Figure 3D:
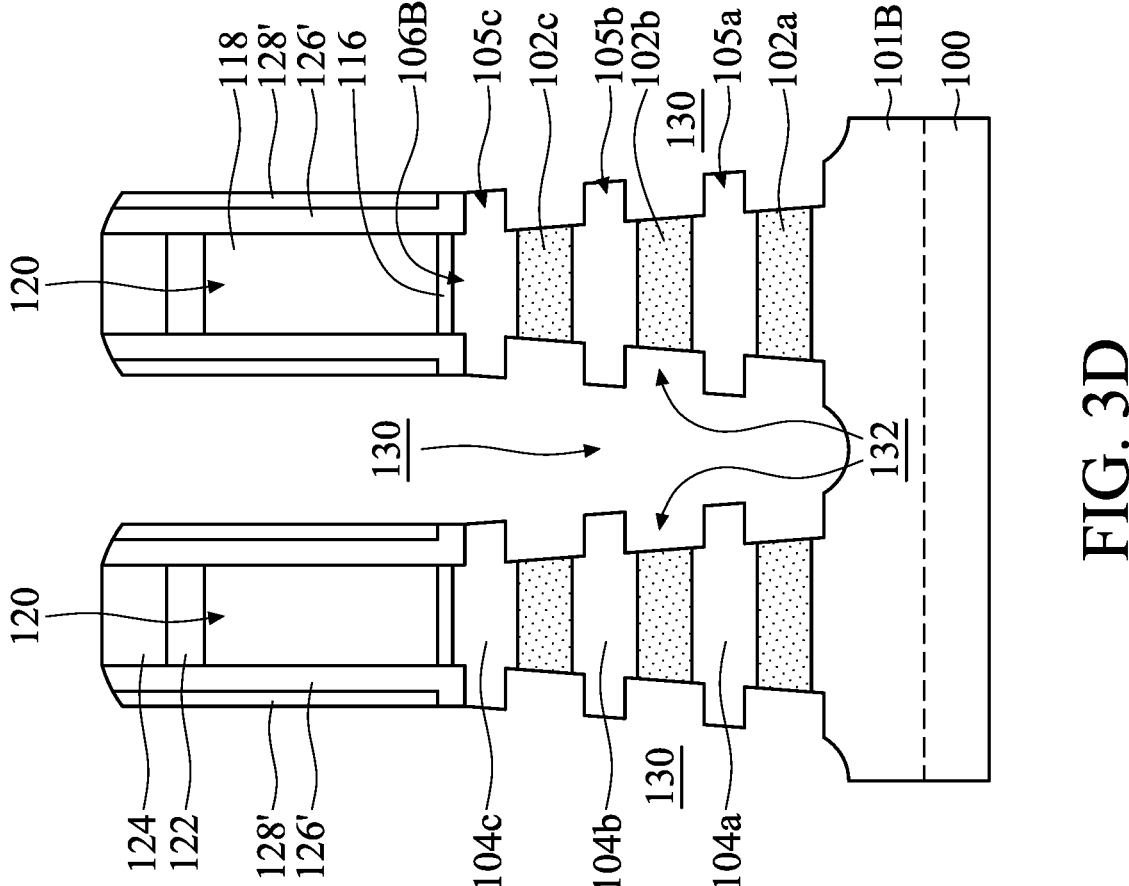

As shown in FIG. 3D, the semiconductor layers 102*a*-102*c* are laterally etched, in accordance with some embodiments. As a result, edges of the semiconductor layers 102*a*-102*c* retreat from edges of the semiconductor layers 104*a*-104*c*. As shown in FIG. 3D, recesses 132 are formed due to the lateral etching of the semiconductor layers 102*a*-102*c*. The recesses 132 may be used to contain inner spacers that will be formed later. The semiconductor layers 102*a*-102*c* may be laterally etched using a wet etching process, a dry etching process, or a combination thereof. In some other embodiments, the semiconductor layers 102*a*-102*c* are partially oxidized before being laterally etched.

During the lateral etching of the semiconductor layers 102*a*-102*c*, the semiconductor layers 104*a*-104*c* may also be slightly etched. As a result, edge portions of the semiconductor layers 104*a*-104*c* are partially etched and thus shrink to form edge elements 105*a*-105*c*, as shown in FIG. 3D. As shown in FIG. 3D, each of the edge elements 105*a*-105*c* of the semiconductor layers 104*a*-104*c* is thinner than the corresponding inner portion of the semiconductor layers 104*a*-104*c*.

Figure 3E:
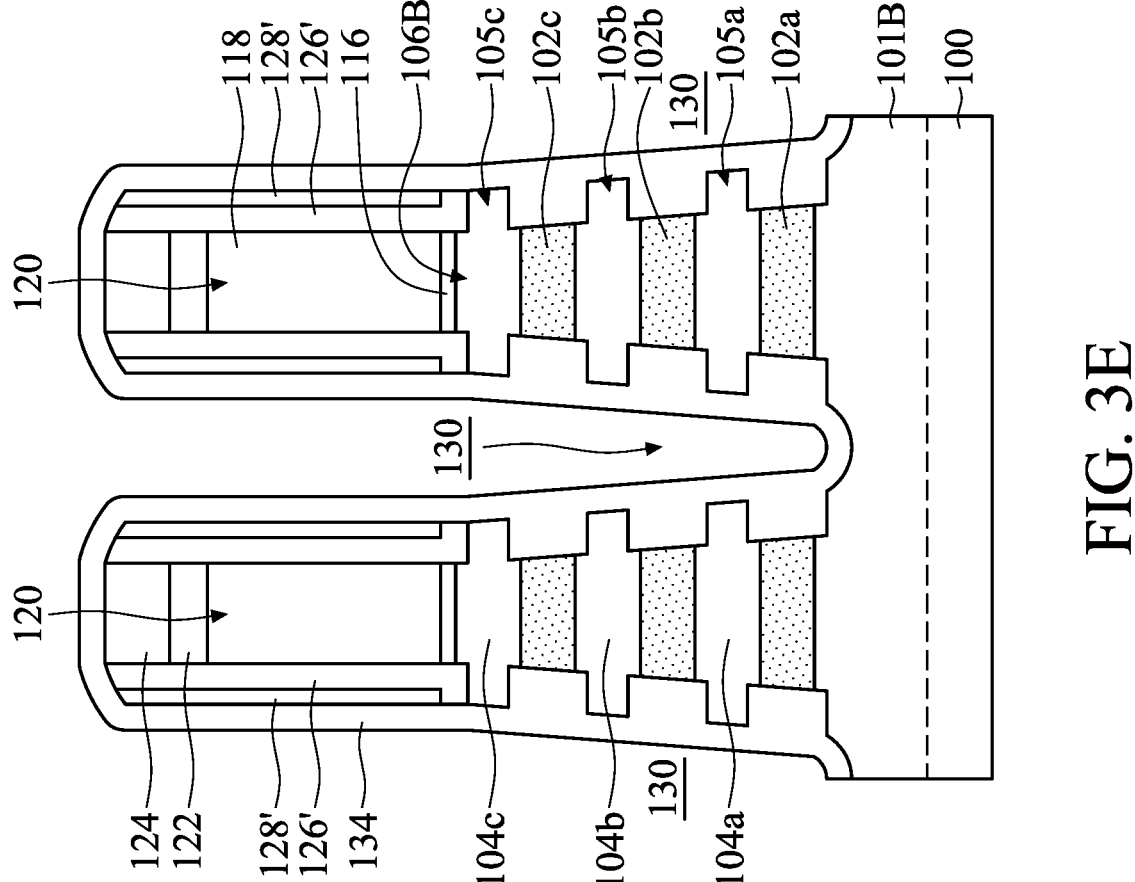

As shown in FIG. 3E, an insulating layer 134 is deposited over the structure shown in FIG. 3D, in accordance with some embodiments. The insulating layer 134 covers the dummy gate stacks 120 and fills the recesses 132. The insulating layer 134 may be made of or include carbon-containing silicon nitride (SiCN), carbon-containing silicon oxynitride (SiOCN), carbon-containing silicon oxide (SiOC), silicon oxide, silicon nitride, another suitable material, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, another applicable process, or a combination thereof.

Figure 3F:
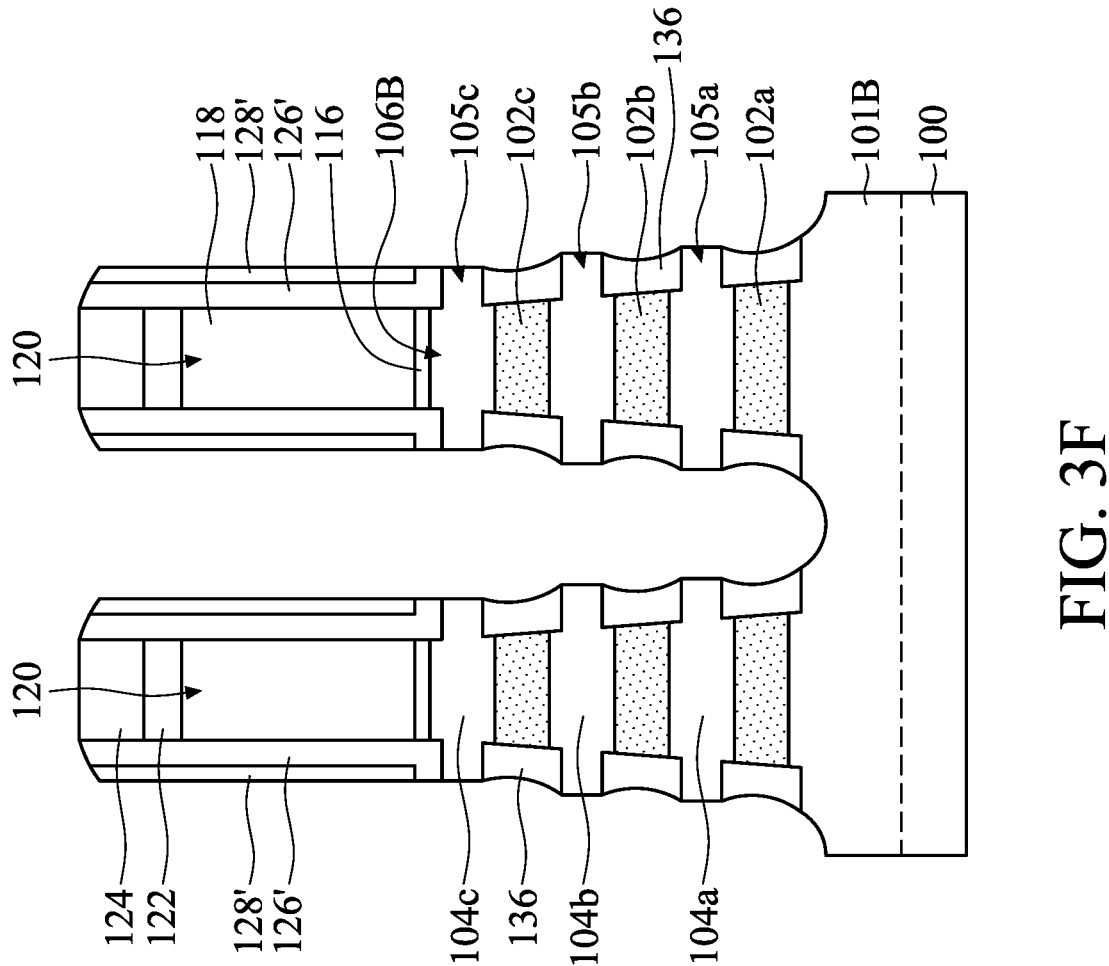

As shown in FIG. 3F, an etching process is used to partially remove the insulating layer 134, in accordance with some embodiments. The portions of the insulating layer 134 outside of the recesses 132 may be removed. The remaining portions of the insulating layer 134 form inner spacers 136, as shown in FIG. 3F. The etching process may include a dry etching process, a wet etching process, or a combination thereof. Each of the inner spacers 136 may have a thickness that is within a range from about 4 nm to about 6 nm.

The inner spacers 136 cover the edges of the semiconductor layers 102*a*-102*c*. The inner spacers 136 may be used to prevent subsequently formed epitaxial structures (which function as source/drain structures, for example) from being damaged during a subsequent process for removing the semiconductor layers 102*a*-102*c*. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101B originally covered by the insulating layer 134 are exposed by the recesses 130, as shown in FIG. 3F. The edges of the semiconductor layers 104*a*-104*c* are exposed by the recesses 130, as shown in FIG. 3F.

Figure 3G:
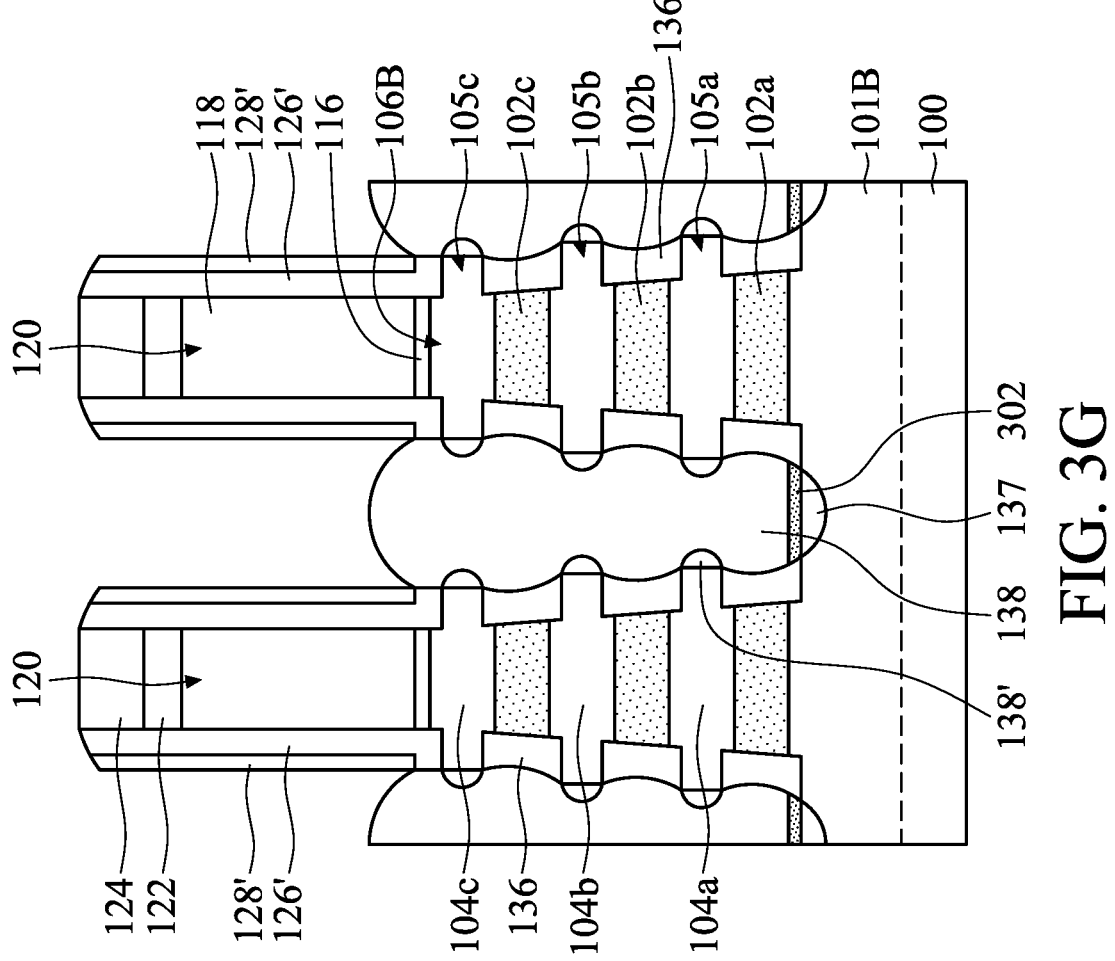

As shown in FIG. 3G, semiconductor isolation structures 137 are formed over the bottoms of the recesses 130, in accordance with some embodiments. In some embodiments, the semiconductor isolation structures 137 are epitaxial structures that are undoped. In some embodiments, the semiconductor isolation structures 137 are substantially free of n-type dopants or p-type dopants. The semiconductor isolation structures 137 may help to reduce or prevent current leakage from epitaxial structures that will be formed. The semiconductor isolation structures 137 may provide relative planar surfaces, so as to facilitate the subsequent formation of the epitaxial structures.

The semiconductor isolation structures 137 may be made of or include silicon, silicon germanium, another suitable material, or a combination thereof. The semiconductor isolation structures 137 may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, another applicable process, or a combination thereof. In some embodiments, the formation of the semiconductor isolation structures 137 involve one or more etching processes that are used to fine-tune the profiles of the semiconductor isolation structures 137.

Afterwards, bottom isolation elements 302 are selectively formed on the semiconductor isolation structures 137, as shown in FIG. 3G in accordance with some embodiments. The bottom isolation elements 302 may prevent leakage current between the semiconductor fin 101B and the epitaxial structures that will be formed on the bottom isolation elements 302.

In some embodiments, the bottom isolation elements 302 are made of or include a dielectric material. The dielectric material may include silicon oxide, silicon nitride, carbon-containing silicon nitride, carbon-containing silicon oxynitride, carbon-containing silicon oxide, aluminum oxide, hafnium oxide, another suitable material, or a combination thereof. The formation of the bottom isolation elements 302 may involve one or more deposition processes and one or more patterning processes.

However, embodiments of the disclosure are not limited thereto. Many variations and/or modifications can be made to embodiments of the disclosure. In some other embodiments, the bottom isolation elements 302 are not formed.

As shown in FIG. 3G, epitaxial structures 138 are formed on the bottom isolation elements 302 and the side surfaces of the semiconductor layers 104a-104c, in accordance with some embodiments. In some embodiments, the top surfaces of the epitaxial structures 138 are higher than the top surface of the dummy gate dielectric layer 116, as shown in FIG. 3G. In some other embodiments, the epitaxial structures 138 are substantially as high as the tops of the edge portions 105c.

In some embodiments, the epitaxial structures 138 connect to the semiconductor layers 104a-104c. Each of the semiconductor layers 104a-104c is sandwiched between two of the epitaxial structures 138. In some embodiments, the epitaxial structures 138 have lightly doped portions 138' adjacent to the semiconductor layers 104a-104c. The dopant concentration of the lightly doped portions 138' is lower than other portions of the epitaxial structures 138.

In some embodiments, the epitaxial structures 138 are p-type doped regions. The epitaxial structures 138 may include epitaxially grown silicon germanium (SiGe), epitaxially grown silicon, or another suitable epitaxially grown semiconductor material. P-type dopants may include boron, another suitable element, or a combination thereof.

However, embodiments of the disclosure are not limited thereto. In some other embodiments, the epitaxial structures 138 are n-type doped regions. The epitaxial structures 138 may include epitaxially grown silicon, epitaxially grown silicon carbide (SiC), epitaxially grown germanium, or another suitable epitaxially grown semiconductor material. N-type dopants may include phosphor, arsenic, another suitable element, or a combination thereof.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, another applicable process, or a combination thereof. In some embodiments, the epitaxial structures 138 are further exposed to one or more annealing processes to activate the dopants. For example, a rapid thermal annealing process is used.

FIGS. 4A-4L are perspective views of various stages of a process for forming a portion of a semiconductor device structure, in accordance with some embodiments. The structure shown in FIG. 4A may be formed using the processes that are the same as or similar to those illustrated in FIGS. 2A-2D and 3A-3G. In some embodiments, FIG. 3G is the cross-sectional view of a portion of the structure shown in FIG. 4A.

Figure 4A:
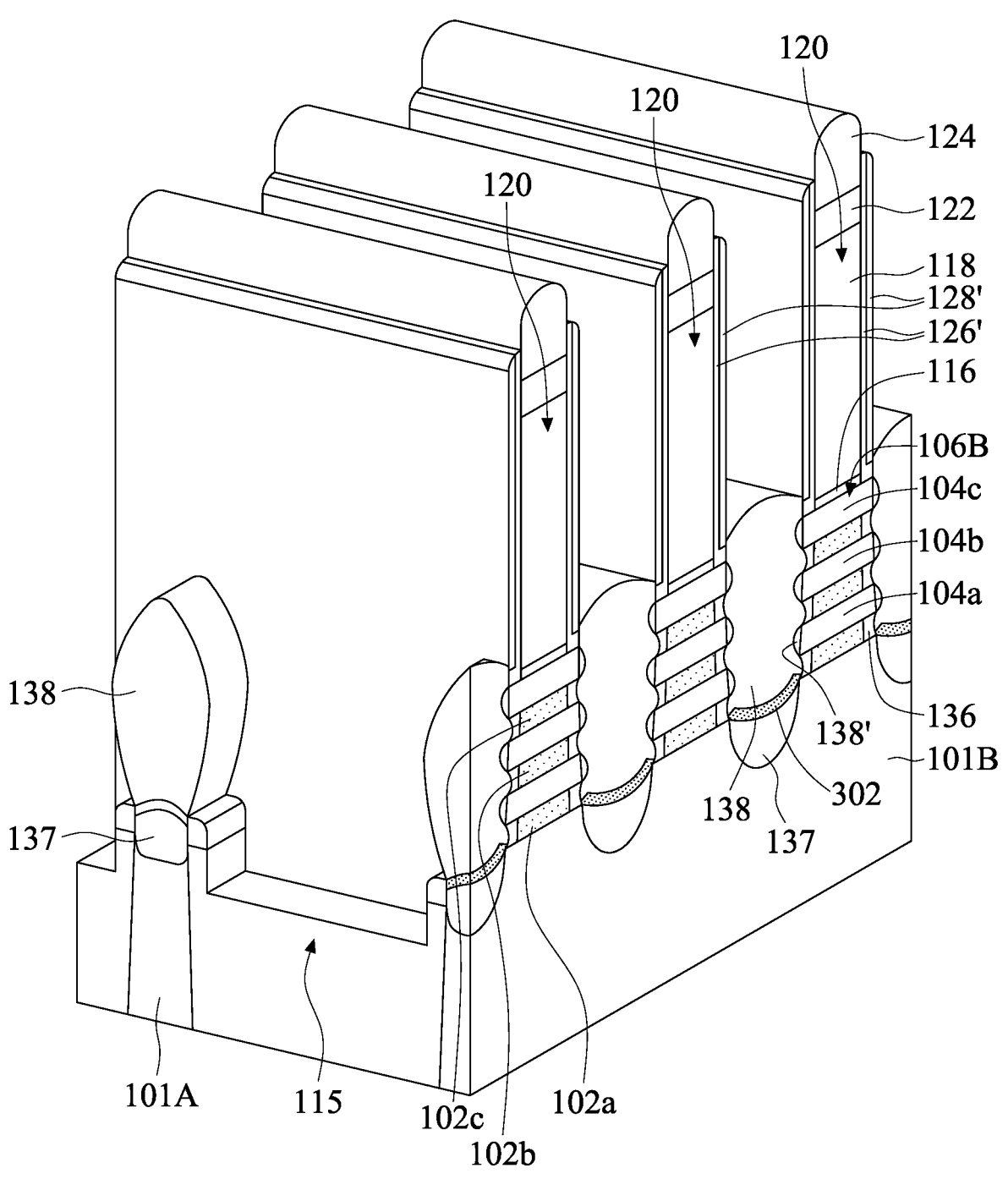
FIGS. 4A-4L are perspective views of various stages of a process for forming a portion of a semiconductor device structure, in accordance with some embodiments.
Figure 4B:
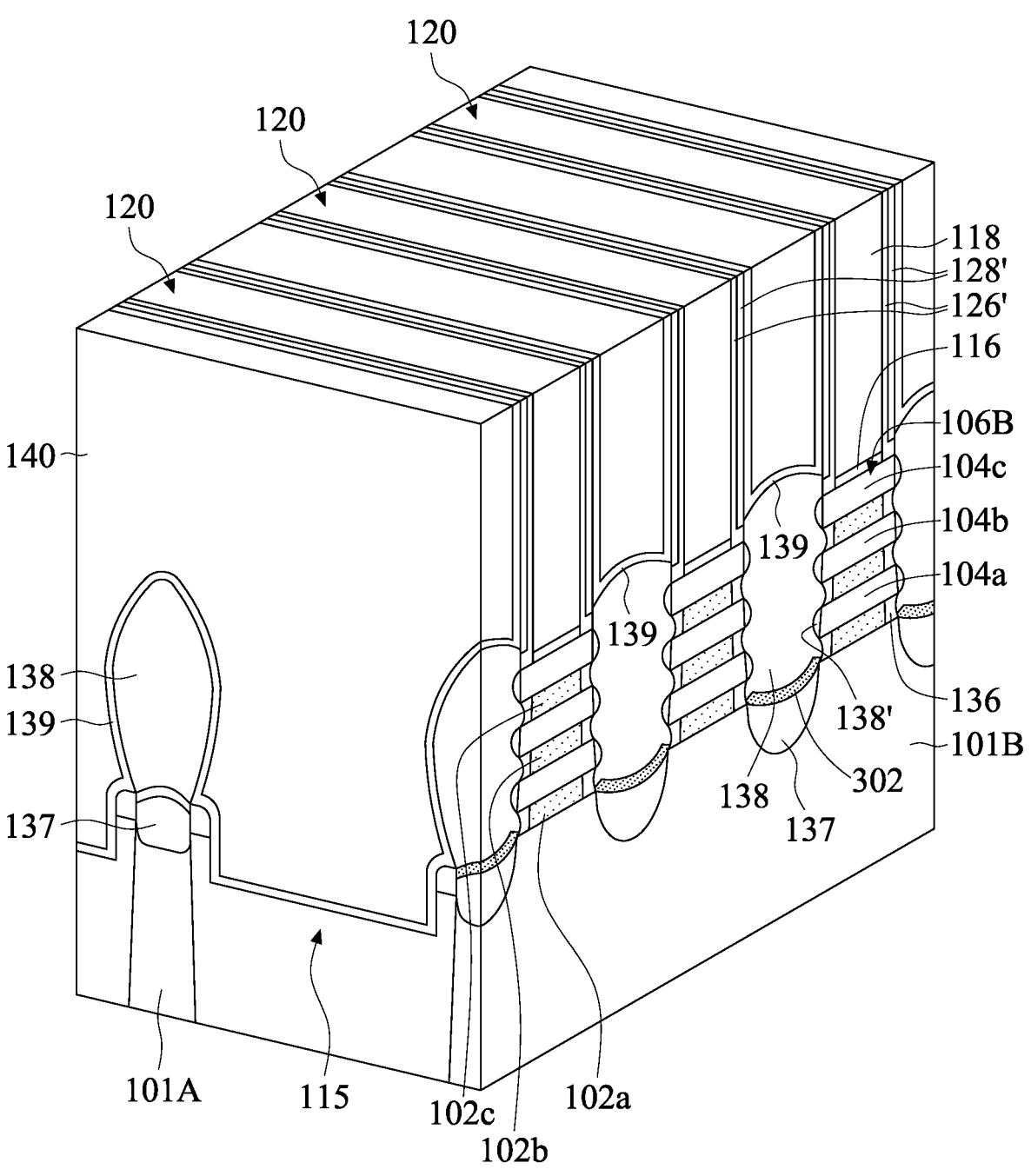

As shown in FIG. 4B, a contact etch stop layer 139 and a dielectric layer 140 are formed over the structure shown in FIG. 4A to laterally surround the epitaxial structures 138 and the dummy gate stacks 120, in accordance with some embodiments. The contact etch stop layer 139 may be made of or include silicon nitride, silicon oxynitride, silicon carbide, carbon-containing silicon nitride, carbon-containing silicon oxynitride, carbon-containing silicon oxide, aluminum oxide, another suitable material, or a combination thereof. The contact etch stop layer 139 may have a thickness that is within a range from about 4 nm to about 5 nm. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof.

In some embodiments, an etch stop material layer and a dielectric material layer are sequentially deposited over the structure shown in FIG. 4A. The etch stop material layer may be deposited using a CVD process, an ALD process, a PVD process, another applicable process, or a combination thereof. The dielectric material layer may be deposited using an FCVD process, a CVD process, an ALD process, another applicable process, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 4B. The planarization process may include a CMP process, a grinding process, an etching process, a dry polishing process, another applicable process, or a combination thereof. In some embodiments, the mask layers 122 and 124 over the dummy gate stacks 120 are removed during the planarization process. In some embodiments, after the planarization process, the top surfaces of the contact etch stop layer 139, the dielectric layer 140, and the dummy gate electrodes 118 are substantially level with each other.

Figure 4C:
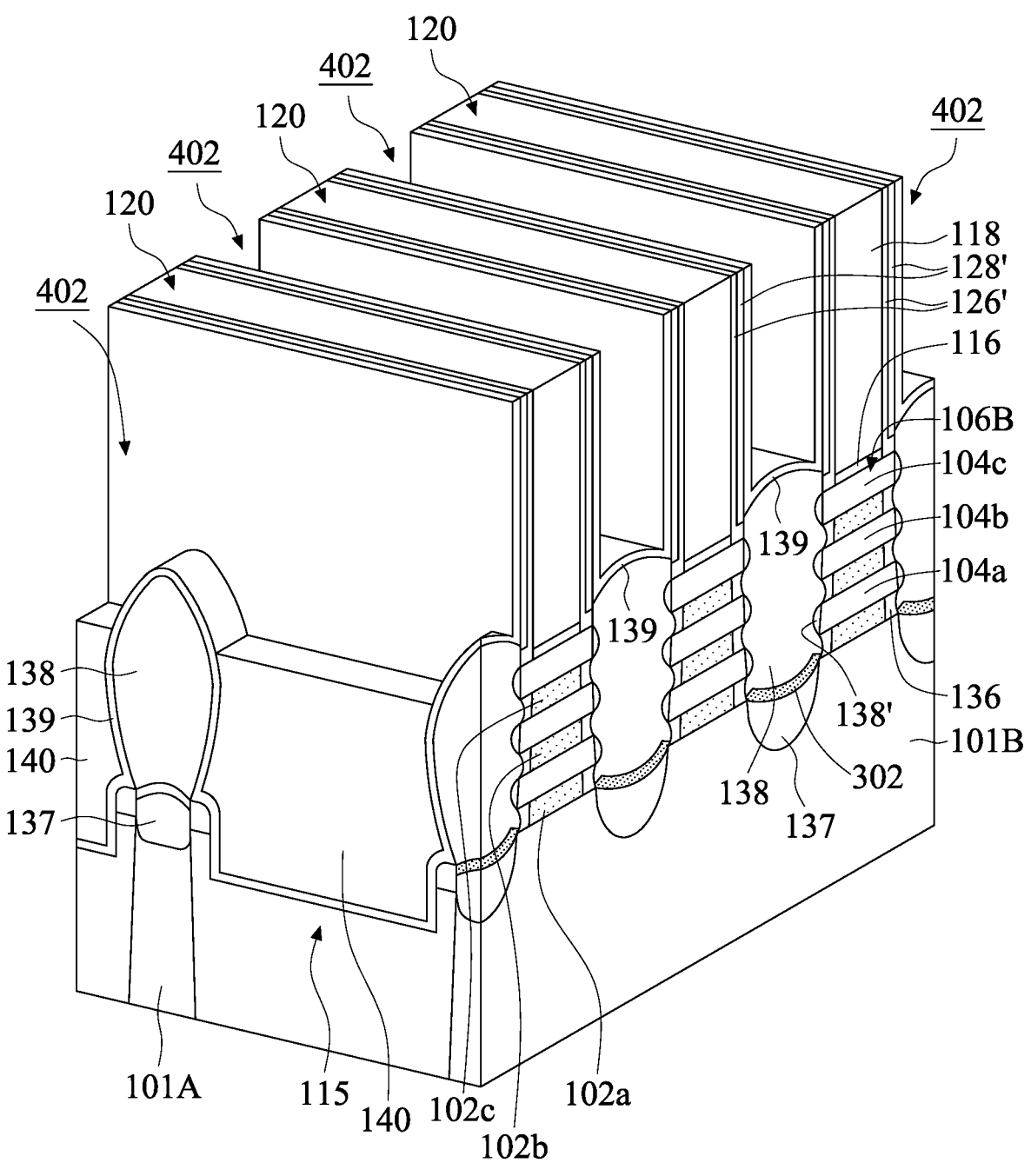

As shown in FIG. 4C, the dielectric layer 140 is partially removed so that recesses 402 exposing the contact etch stop layer 139 is formed, in accordance with some embodiments. As shown in FIG. 4C, the portions of the contact etch stop layer 139 that extend along the sidewalls of the dummy gate stacks 120 and the upper portions of the epitaxial structures 138 are exposed by the recesses 402. In some embodiments, the top surface of the dielectric layer 140 is positioned at a height level that is between the tops and the bottoms of the epitaxial structures 138. One or more etching processes may be used to form the recesses 402.

Figure 4D:
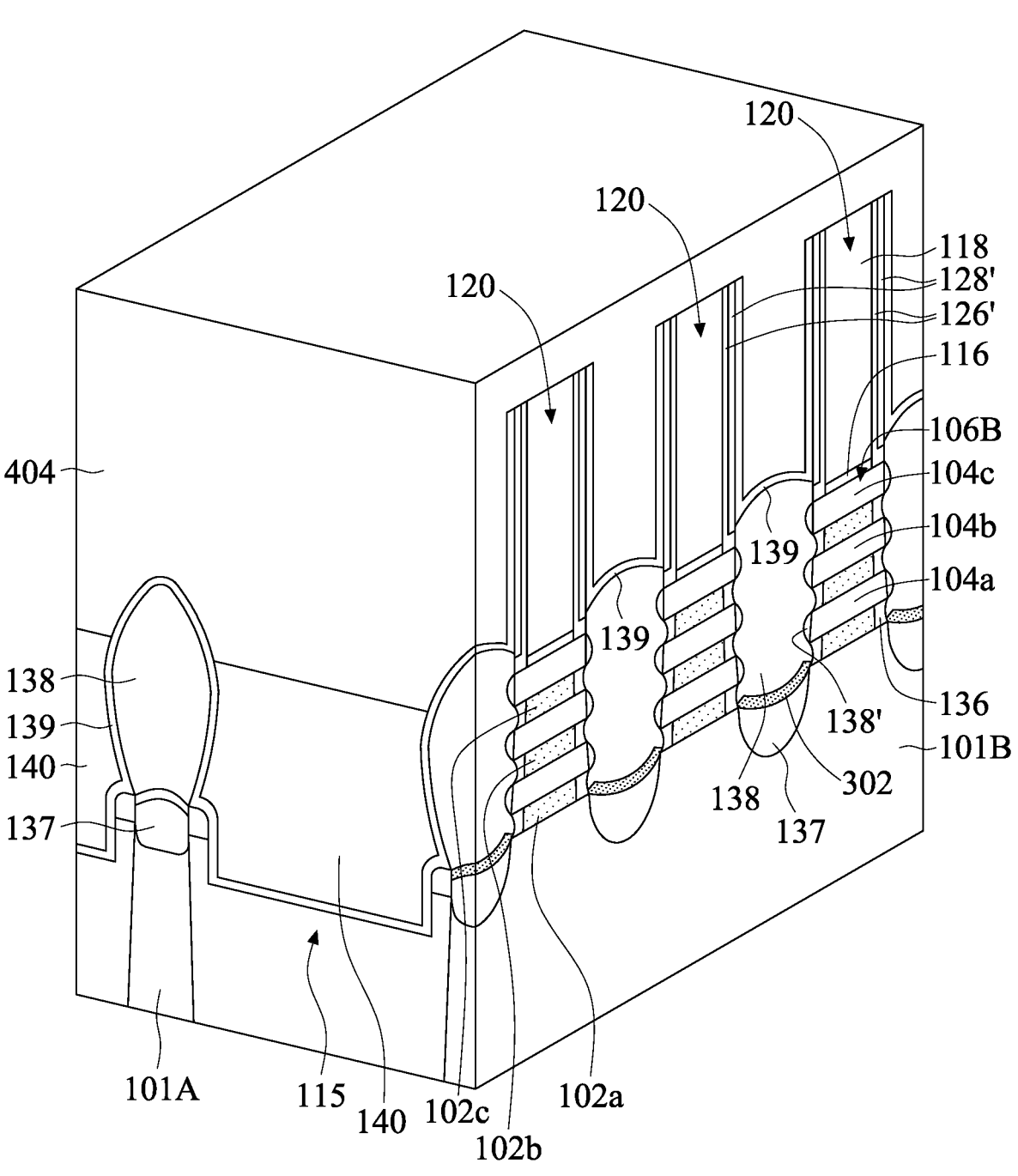

As shown in FIG. 4D, a protective material layer 404 is deposited over the contact etch stop layer 139, the dummy gate stacks 120, and the dielectric layer 150 to overfill the recesses 402, in accordance with some embodiments. The protective material layer 404 may be made of a material that has etching selectivity to a dielectric layer (such as an oxide layer) that will be formed later. The protective material layer 404 may be made of or include silicon nitride, silicon oxynitride, carbon-containing silicon nitride, carbon-containing silicon oxynitride, another suitable material, or a combination thereof. The protective material layer 404 may be deposited using a CVD process, an ALD process, an FCVD process, another applicable process, or a combination thereof.

Figure 4E:
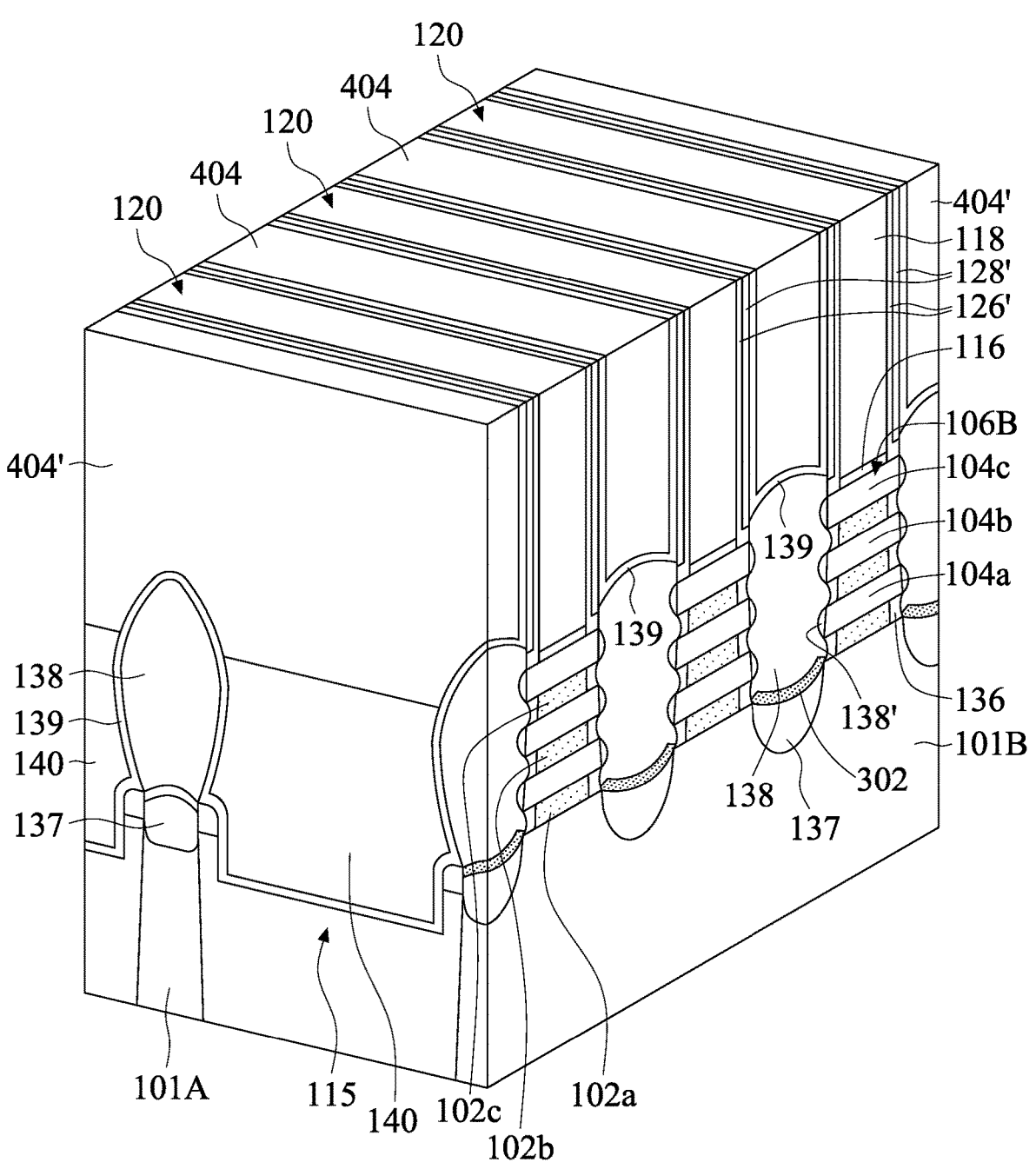

As shown in FIG. 4E, the protective material layer 404 is planarized so that the dummy gate stacks 120 are exposed, in accordance with some embodiments. The remaining portions of the protective material layer 404 form multiple protective caps 404'. The protective material layer 404 may be planarized using a CMP process, a grinding process, an etching process, a dry polishing process, another applicable process, or a combination thereof.

Figure 4F:
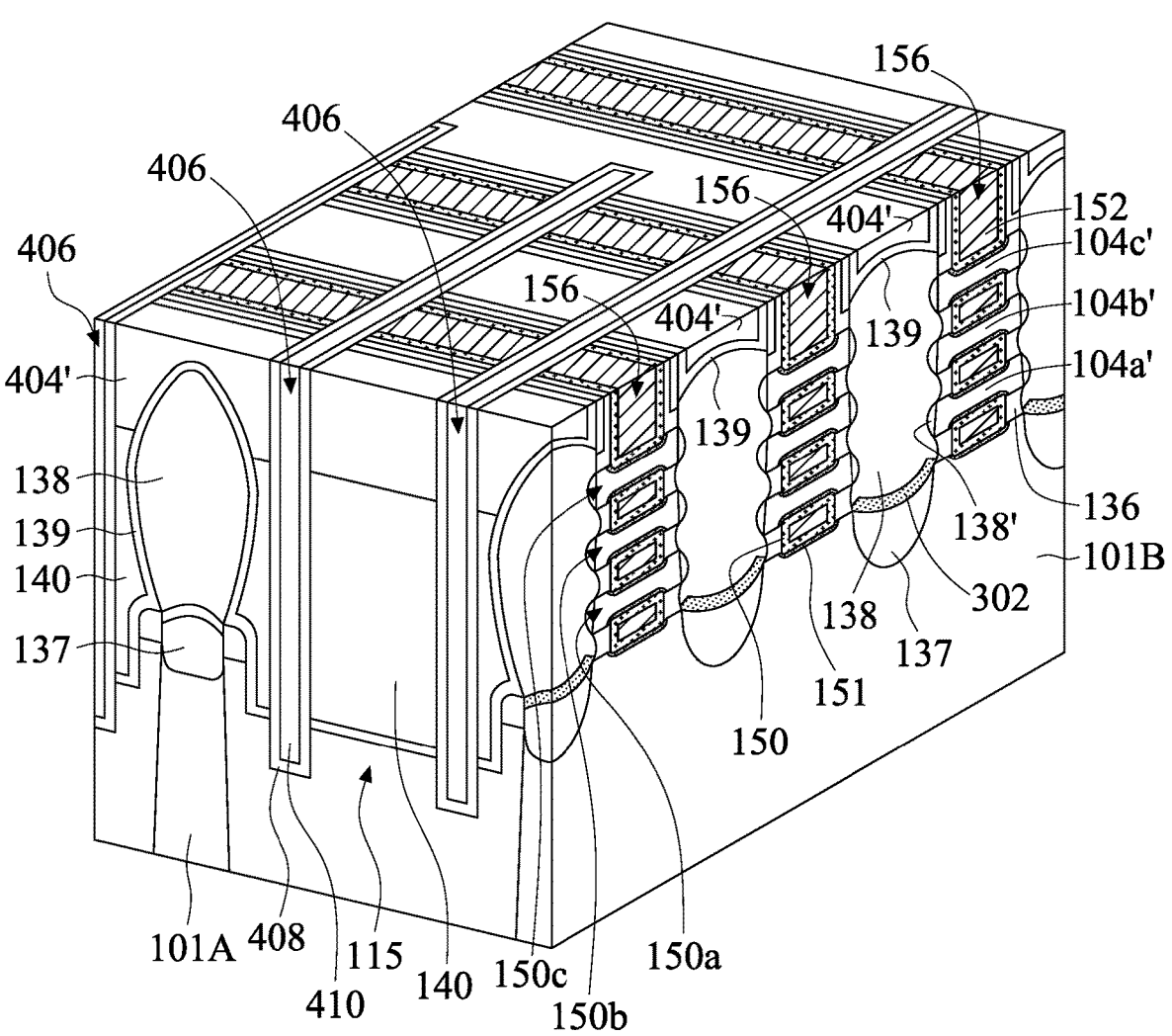

Afterwards, a gate replacement process is performed to replace the dummy gate stacks 120 with metal gate stacks 156, as shown in FIG. 4F in accordance with some embodiments. The dummy gate electrodes 118 are removed to form trenches using one or more etching processes, in accordance with some embodiments. The trenches expose the dummy gate dielectric layer 116.

Afterwards, the dummy gate dielectric layer 116 and the semiconductor layers 102a-102c (which function as sacrificial layers) are removed, in accordance with some embodiments. In some embodiments, one or more etching processes are used to remove the dummy gate dielectric layer 116 and the semiconductor layers 102a-102c. As a result, recesses are formed between the inner spacers 136.

Due to high etching selectivity, the semiconductor layers 104a-104c are slightly (or substantially not) etched. The remaining portions of the semiconductor layers 104a-104c form multiple semiconductor nanostructures 104a'-104c'. The semiconductor nanostructures 104a'-104c' are constructed by or made up of the remaining portions of the semiconductor layers 104a-104c. The semiconductor nanostructures 104a'-104c' may function as channel structures of transistors.

In some embodiments, the etchant used for removing the semiconductor layers 102a-102c also slightly removes the semiconductor layers 104a-104c that form the semiconductor nanostructures 104a'-104c'. As a result, the obtained semiconductor nanostructures 104a'-104c' become thinner after the removal of the semiconductor layers 102a-102c. In some embodiments, each of the semiconductor nanostructures 104a'-104c' is thinner than the edge portions 105a-105c since the edge portions 105a-105c are surrounded by other elements and thus are prevented from being reached and etched by the etchant.

After the removal of the semiconductor layers 102a-102c (which function as sacrificial layers), the recesses are formed. The recesses surround each of the semiconductor nanostructures 104a'-104c'. Even if the recesses between the semiconductor nanostructures 104a'-104c' are formed, the semiconductor nanostructures 104a'-104c' remain held by the epitaxial structures 138. Therefore, after the removal of the semiconductor layers 102a-102c (which function as sacrificial layers), the released semiconductor nanostructures 104a'-104c' are prevented from falling.

During the removal of the semiconductor layers 102a-102c (which function as sacrificial layers), the inner spacers 136 protect the epitaxial structures 138 from being etched or damaged. The quality and reliability of the semiconductor device structure are improved.

Afterwards, metal gate stacks 156 are formed to fill the trenches, in accordance with some embodiments. The metal gate stacks 156 further extend into the recesses to wrap around each of the semiconductor nanostructures 104a'-104c'. Each of the metal gate stacks 156 includes multiple metal gate stack layers. Each of the metal gate stacks 156 may include interfacial layers 151, a gate dielectric layer 150, and a metal gate electrode 152.

The metal gate electrode 152 may include one or more work function layers. The metal gate electrode 152 may further include a conductive filling. In some embodiments, the formation of the metal gate stacks 156 involves the deposition of multiple metal gate stack layers over the dielectric layer 140 to fill the trenches and the recesses. The metal gate stack layers extend into the recesses to wrap around each of the semiconductor nanostructures 104a'-104c'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, another applicable process, or a combination thereof.

In some embodiments, before the formation of the gate dielectric layer 150, interfacial layers 151 are formed on the surfaces of the semiconductor nanostructures 104a'-104c'. The interfacial layers 151 are very thin and are made of, for example, silicon oxide or germanium oxide. In some embodiments, the interfacial layers 151 are formed by applying an oxidizing agent on the surfaces of the semiconductor nanostructures 104a'-104c'. For example, a hydrogen peroxide-containing liquid may be applied or provided on the surfaces of the semiconductor nanostructures 104a'-104c' so as to form the interfacial layers 151.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, another suitable material, or a combination thereof. For example, the p-type metal includes tantalum nitride, tungsten nitride, titanium, titanium nitride, another suitable material, or a combination thereof.

In some other embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, another suitable material, or a combination thereof. In some embodiments, the n-type work function is an aluminum-containing layer. The aluminum-containing layer may be made of or include TiAlC, TiAlO, TiAlN, another suitable material, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electrochemical plating process, another applicable process, or a combination thereof.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, another suitable material, or a combination thereof. The barrier layer may be deposited using an ALD process, a CVD process, a PVD process, an electroplating process, an electrochemical plating process, another applicable process, or a combination thereof.

In some embodiments, different portions of the metal gate stacks 156 are wrapped around semiconductor nanostructures 104a'-104c' of PMOS devices and NMOS devices. Different portions of the metal gate stacks 156 thus have different types of work function layer or different combinations of work functions layers. Multiple deposition processes and multiple patterning processes may be used to selectively form different work function layers at different portions of the metal gate stacks 156.

In some embodiments, the conductive fillings of the metal gate electrodes 152 are made of or include a metal material. The metal material may include tungsten, ruthenium, aluminum, copper, cobalt, another suitable material, or a combination thereof. A conductive layer used for forming the conductive filling may be deposited over the work function layer using a CVD process, an ALD process, a PVD process, an electroplating process, an electrochemical plating process, a spin coating process, another applicable process, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, another suitable material, or a combination thereof. The blocking layer may be deposited using an ALD process, a PVD process, an electroplating process, an electrochemical plating process, another applicable process, or a combination thereof.

Afterwards, a planarization process is performed to remove the portions of the metal gate stack layers outside of the trenches, in accordance with some embodiments. As a result, the remaining portions of the metal gate stack layers form the metal gate stacks 156, as shown in FIG. 4F.

As shown in FIG. 4F, multiple dielectric structures 406 are formed to separate each of the metal gate stacks 156 into two or more separate portions, in accordance with some embodiments. In some embodiments, the separate portions of the metal gate stacks 156 are physically and/or electrically isolated from each other by the dielectric structures 406. In some embodiments, the dielectric structures 406 penetrate through the protective caps 404', the metal gate stacks 156, the dielectric layer 140, and the contact etch stop layer 139, as shown in FIG. 4F. In some embodiments, the dielectric structures 406 further extend into the isolation structure 115.

In some embodiments, each of the dielectric structures 406 includes a protective liner layer 408 and a dielectric filling 410, as shown in FIG. 4F. The protective liner layer 408 may be made of a dielectric layer that is substantially free of oxygen. The protective liner layer 408 may be made of or include silicon nitride, carbon-containing silicon nitride, another suitable material, or a combination thereof. In some embodiments, the dielectric filling 410 has a lower dielectric constant than that of the protective liner layer 408. The dielectric filling 410 may be made of or include silicon oxide, silicon oxynitride, carbon-containing silicon oxide, carbon-containing silicon oxynitride, another suitable material, or a combination thereof. The protective liner layer 408 may help to prevent oxygen of the dielectric filling 410 from diffusing into the metal gate stacks 156 that are nearby. The quality and reliability of the metal gate stacks 156 may thus be ensured.

In some embodiments, one or more photolithography processes and one or more etching processes are used to form multiple trenches that are used to contain the dielectric structures 406. Afterwards, a liner material layer and a dielectric material layer are sequentially deposited to overfill the trenches. A planarization process is then used to partially remove the liner material layer and the dielectric material layer. As a result, remaining portions of the liner material layer and the dielectric material layer respectively form the protective liner layers 408 and the dielectric fillings 410 of the dielectric structures 406. The planarization process may include a CMP process, a grinding process, an etching process, a dry polishing process, another applicable process, or a combination thereof. In some embodiments, due to the planarization process, the top surfaces of the dielectric structures 406, the metal gate stacks 156, the contact etch stop layer 139, and the protective caps 404' are substantially level, as shown in FIG. 4F. In some embodiments, the bottoms of the protective caps 404' are vertically positioned between the tops and bottoms of the epitaxial structures 138.

Figure 4G:
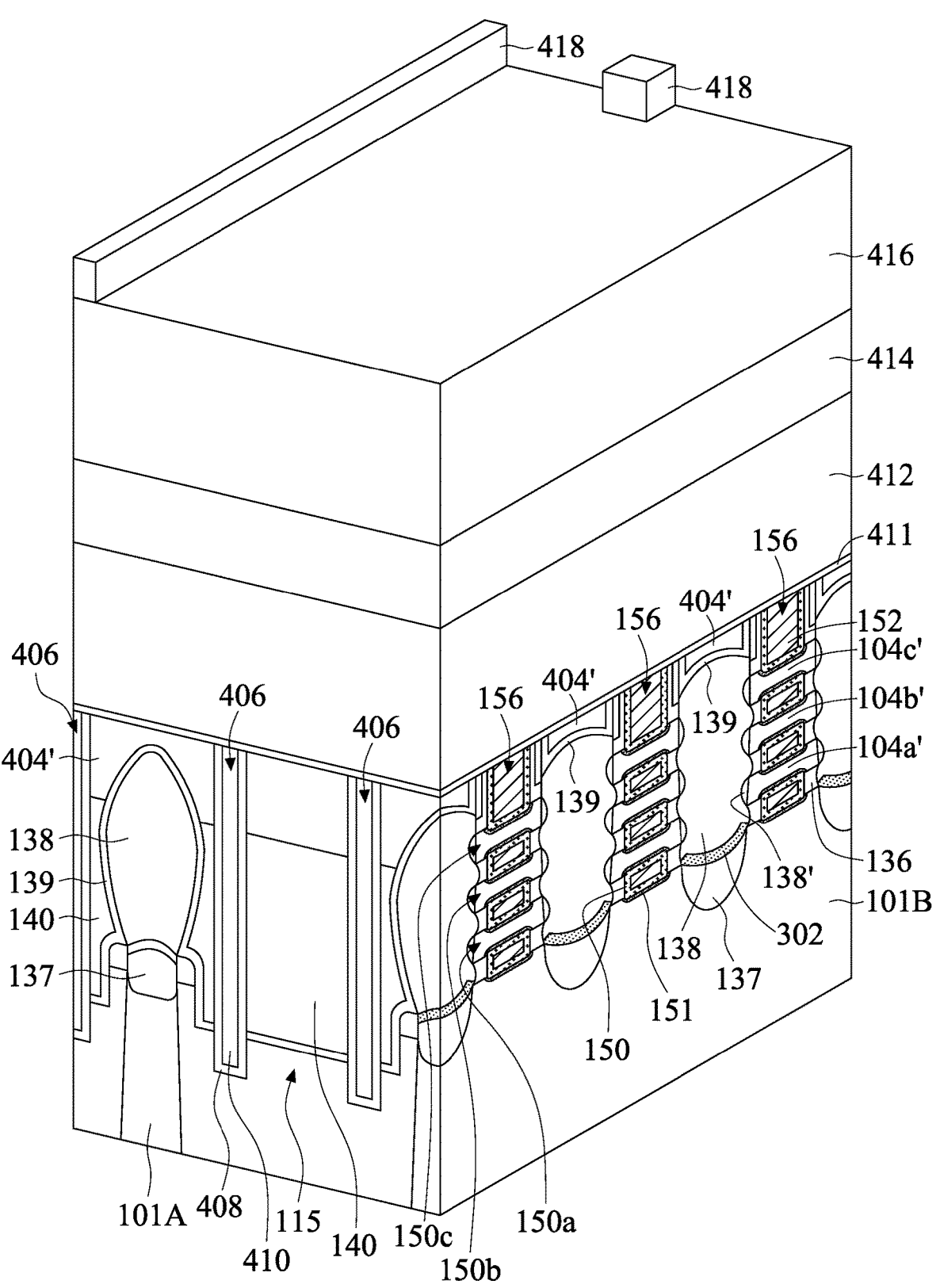

As shown in FIG. 4G, an etch stop layer 411, a dielectric layer 412, a first mask layer 414, and a second mask layer 416 are sequentially deposited over the structure shown in FIG. 4F, in accordance with some embodiments. The material and formation method of the etch stop layer 411 may be the same as or similar to those of the contact etch stop layer 139. The material and formation method of the dielectric layer 412 may be the same as or similar to those of the dielectric layer 140. The first mask layer 414 may be made of or include tungsten carbide or another suitable material. The second mask layer 416 may be made of an oxide material such as silicon oxide. The formation of the etch stop layer 411, the dielectric layer 412, the first mask layer 414, and a second mask layer 416 may be achieved using a CVD process, an ALD process, another applicable process, or a combination thereof.

Afterwards, mask elements 418 are formed over the second mask layer 416, as shown in FIG. 4G in accordance with some embodiments. The mask elements 418 may facilitate a subsequent patterning process of the dielectric layer 412. The mask elements 418 may be made of or include a semiconductor material such as silicon. One or more photolithography processes and one or more etching processes may be used to pattern a silicon layer. As a result, the remaining portions of the silicon layer form the mask elements 418.

Figure 4H:
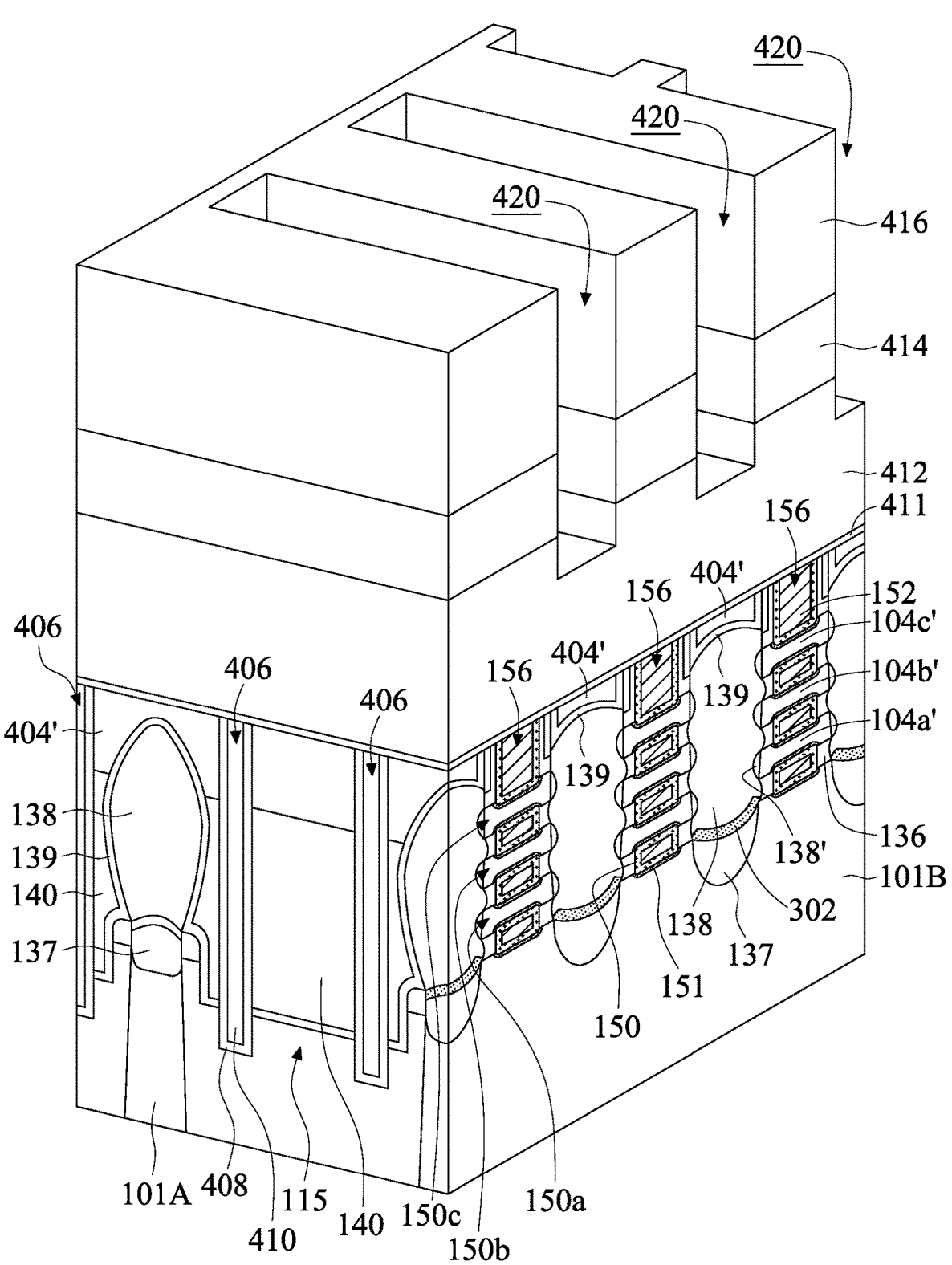

As shown in FIG. 4H, with the mask elements 418 and other patterning mask elements (not shown) as an etching mask, the second mask layer 416 and the first mask layer 414 are partially removed, in accordance with some embodiments. As a result, multiple openings 420 are formed. One or more etching processes may be used to form the openings 420. In some embodiments, the openings 420 extend into the dielectric layer 412, as shown in FIG. 4H.

Figure 4I:
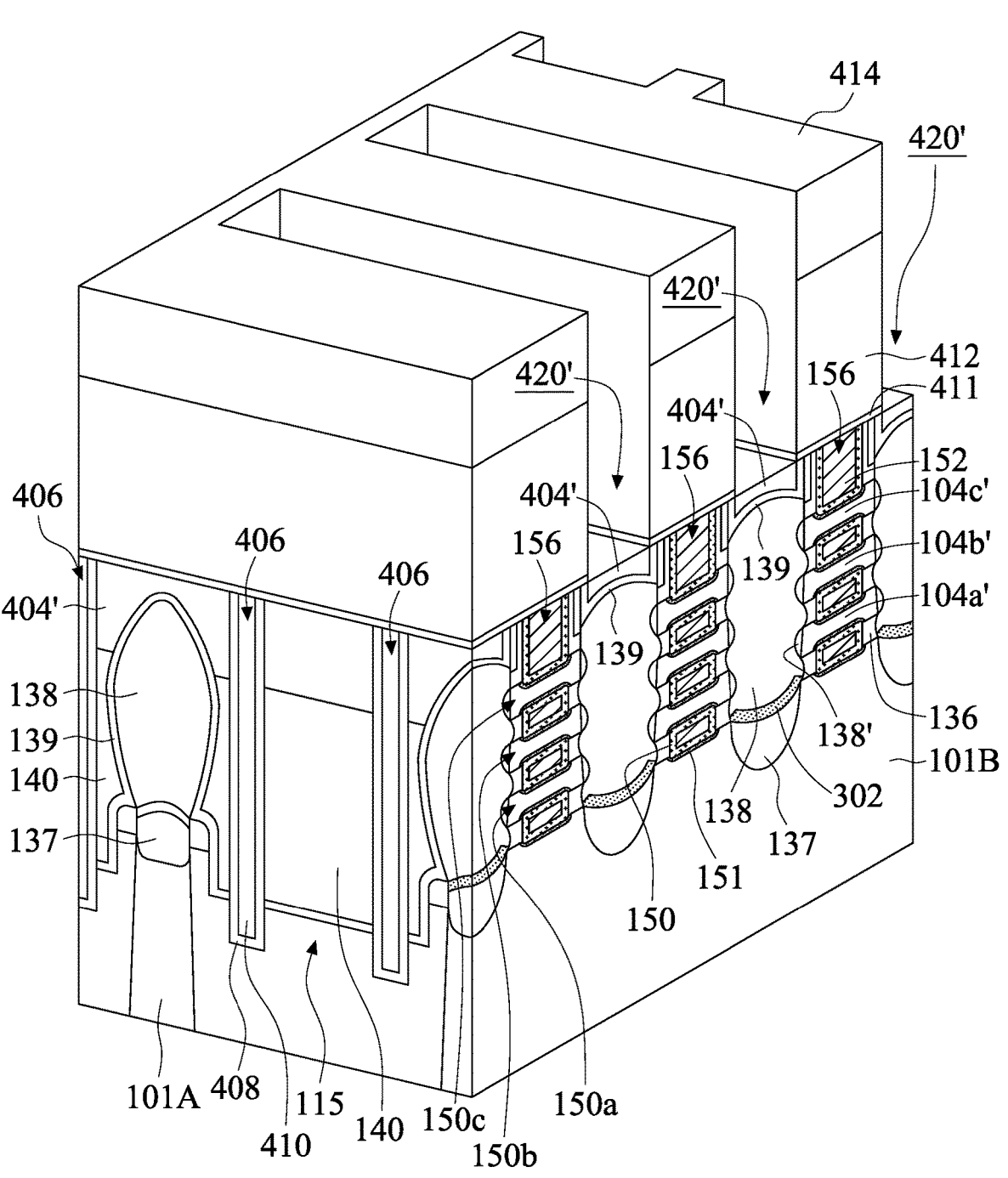

As shown in FIG. 4I, with the first mask layer 414 as an etching mask, the dielectric layer 412 is partially removed, in accordance with some embodiments. As a result, contact openings 420' are formed. The position and profile of the contact openings 420' may be the same as or similar to those of the openings 420. The contact openings 420' expose the etch stop layer 411 over the protective caps 404'. One or more etching processes may be used to form the contact openings 420'. The protective caps 404' may help to confine the contact openings 420' within the predetermined regions, so as to prevent undesired lateral loss of the dielectric layer 412. In some embodiments, during the etching processes, the second mask layer 416 is consumed. In some other embodiments, the second mask layer 416 is removed before the etching process for forming the contact openings 420' is performed.

In some embodiments, an over etching process is used to ensure that the contact openings 420' completely penetrate through the dielectric layer 412. The etch stop layer 411 may thus be partially removed during the over etching process. As a result, the protective caps 404' are exposed by the contact openings 420'. In some embodiments, the protective caps 404' are also partially removed during the over etching process. In some embodiments, due to the over etching process, the protective caps 404' thus have curved upper surfaces.

Figure 4J:
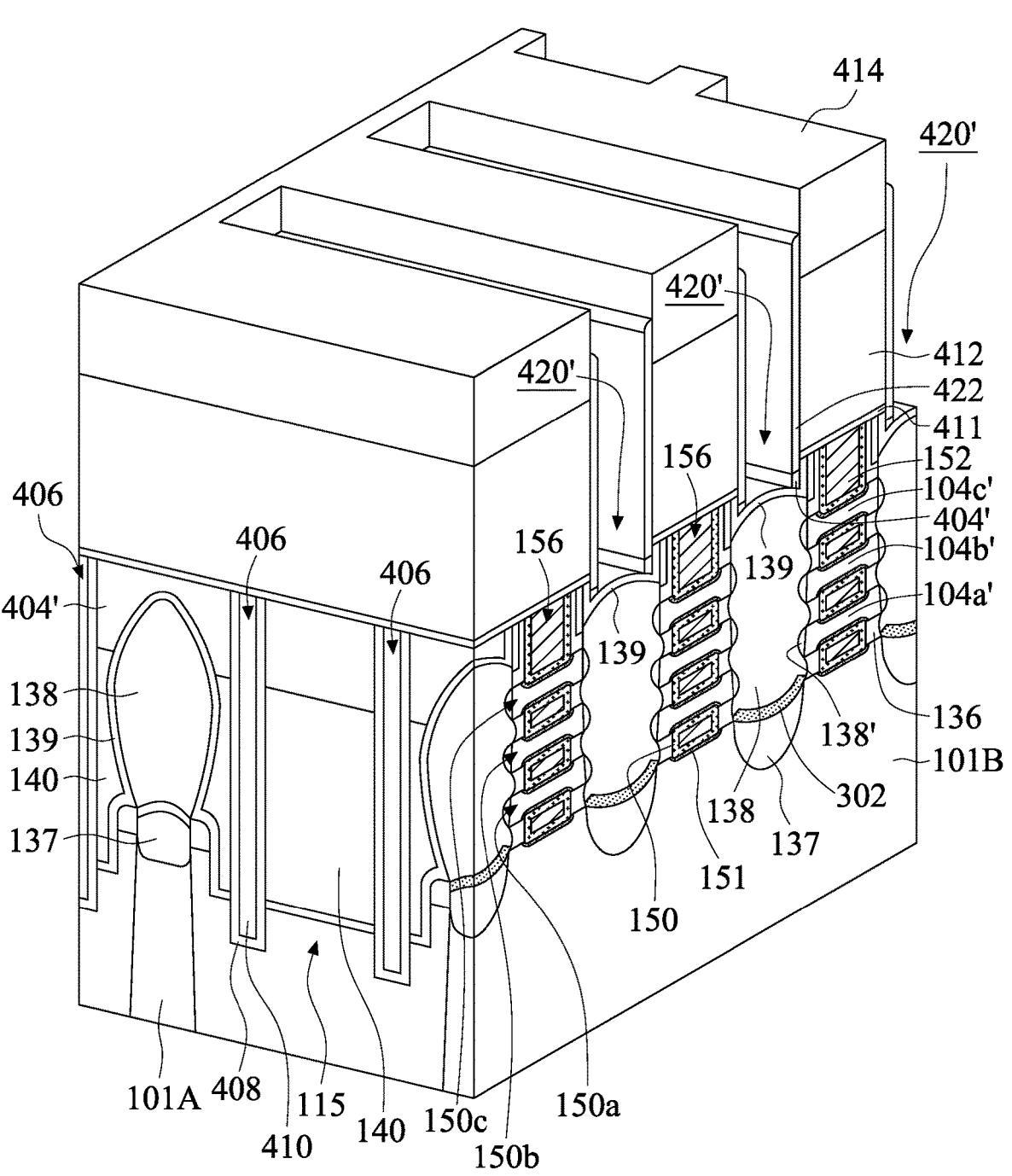

As shown in FIG. 4J, protective layers 422 are formed over sidewalls of the contact openings 420', in accordance with some embodiments. The protective layers 422 may be used to protective the dielectric layer 412 during the subsequent processes. In some embodiments, the protective layers 422 are substantially free of oxygen. The protective layers 422 may be made of or include silicon nitride, carbon-containing silicon nitride, another suitable material, or a combination thereof. However, embodiments of the disclosure have many variations. In some other embodiments, the protective layers 422 contain oxygen. For example, the protective layers 422 are made of or include silicon oxynitride, carbon-containing silicon oxynitride, another suitable material, or a combination thereof. Each of the protective layers 422 may have a thickness that is within a range from about 1 nm to about 3 nm.

In some embodiments, a protective material layer is deposited over the sidewalls and bottoms of the contact openings 420'. The protective material layer may be deposited using a CVD process, an ALD process, another applicable process, or a combination thereof. Afterwards, an anisotropic etching process is used to remove the portions of the protective material layer at the bottoms of the contact openings 420'. As a result, the remaining portions of the protective material layer form the protective layers 422. The protective layers 422 are separated from the epitaxial structures 138 by the contact etch stop layer 139 and the protective caps 404'.

In some embodiments, the anisotropic etching process also partially remove the protective caps 404' so that the contact openings 420' become deeper. In some embodiments, the contact openings 420' expose the contact etch stop layer 139. In some other embodiments, the contact openings 420' expose the epitaxial structures 138.

Figure 4K:
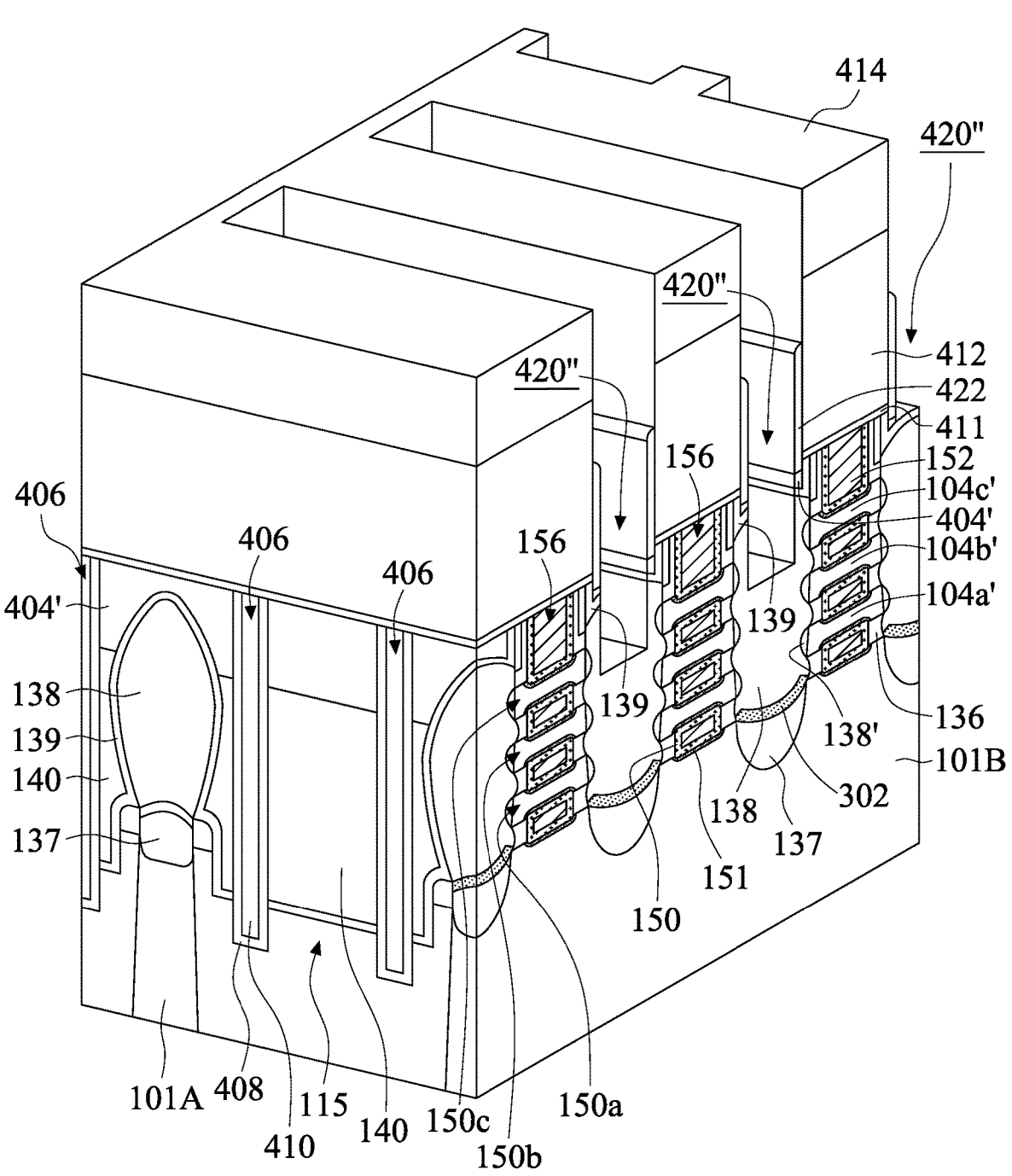

As shown in FIG. 4K, the contact etch stop layer 139 and the epitaxial structures 138 are partially removed, in accordance with some embodiments. As a result, the contact openings 420' are deepened to form contact openings 420". The contact opening 420" extend into the epitaxial structures 138. The contact openings 420" expose interior sidewalls of the epitaxial structures 138, as shown in FIG. 4K. In some embodiments, the protective layers 422 are formed before the contact openings 420' are deepened to form the contact openings 420". The protective layers 422 are prevented from extending along the sidewalls of the epitaxial structures 138.

Afterwards, a cleaning operation is performed to clean the exposed surfaces of the epitaxial structures 138 before a subsequent formation of metal-semiconductor compound elements on the epitaxial structures 138. During the cleaning operation, the protective layers 422 may prevent the dielectric layer 412 from being damaged by the cleaning operation. The position and profile of the contact openings 420" may thus be maintained, which facilitate the subsequent formation of conductive contacts in the contact openings 420".

Figure 4L:
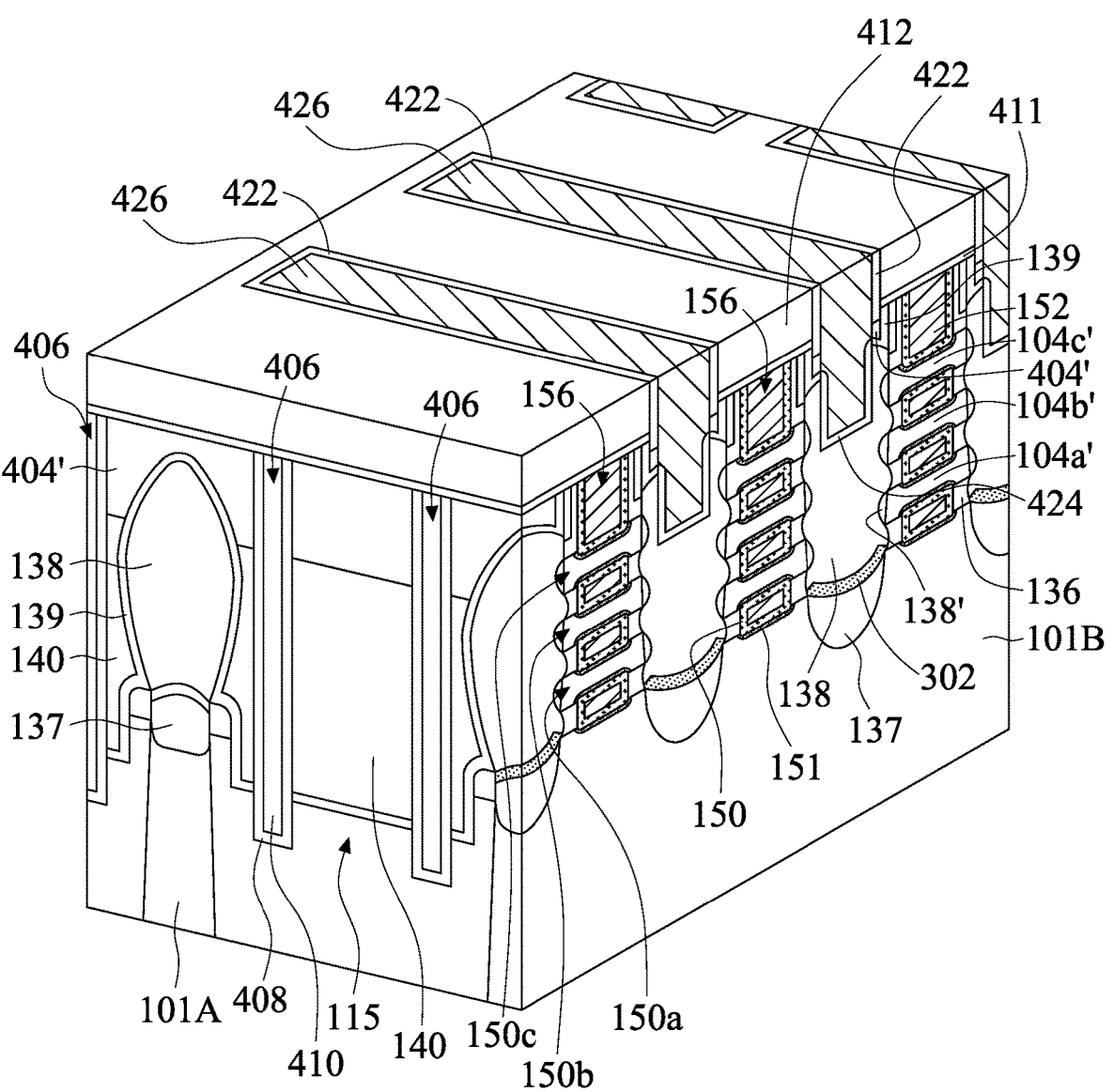

As shown in FIG. 4L, metal-semiconductor compound elements 424 are formed on the surfaces of the epitaxial structures 138 that are exposed by the contact openings 420", in accordance with some embodiments. In some embodiments, before the formation of the metal-semiconductor compound elements 424, the exposed epitaxial structures 138 are modified to assist in the subsequent formation of the metal-semiconductor compound elements 424. In some embodiments, one or more ion implantation processes are used to reduce the crystallinity of the surface portions of the epitaxial structures 138, which allows a subsequently deposited metal material to react with the modified surface portions more easily. The formation of the metal-semiconductor compound elements 424 may thus be facilitated.

In some embodiments, the implantation process is a plasma doping process. Plasma may be introduced into the contact openings 420" to modify the exposed surface portions of the epitaxial structures 138. In some embodiments, reaction gas used in the implantation process includes silicon-containing gas, germanium-containing gas, argon-containing gas, helium-containing gas, another suitable gas, or a combination thereof.

In some embodiments, a thermal operation is performed after a metal-containing material is applied (or deposited) on the epitaxial structures 138. In some other embodiments, a metal-containing material is applied (or deposited) on the epitaxial structures 138 while the epitaxial structures 138 is heated, in accordance with some embodiments. In some embodiments, the metal-containing material is applied (or deposited) using a CVD process, an ALD process, or a combination thereof.

Due to the thermal operation, the thermal energy may help to initiate chemical reaction between the surface portions of the epitaxial structures 138 and the metal-containing material. As a result, the surface portions of the epitaxial structures 138 react with the metal-containing material, and they are transformed into the metal-semiconductor compound elements 424. Each of the metal-semiconductor compound elements 424 may have a thickness that is within a range from about 2 nm to about 6 nm.

The metal-semiconductor compound elements 424 may be made of or include a metal silicide material, a silicon-germanium-metal-containing material, a germanium-metal-containing material, another suitable material, or a combination thereof. For example, the metal-semiconductor compound elements 424 include TiSi, MoSi, RuSi, ZrSi, another suitable material, or a combination thereof.

In some embodiments, during the thermal operation, the epitaxial structures 138 are heated to a temperature that is in a range from about 390 degrees C. to about 440 degrees C. In some other embodiments, before the metal-containing material is applied (or deposited) on the epitaxial structures 138, the epitaxial structures 138 are heated to be at a raised temperature. Afterwards, the epitaxial structures 138 are kept at the raised temperature while the metal-containing material is applied (or deposited). The raised temperature may be in a range from about 390 degrees C. to about 440 degrees C.

In some embodiments, while applying or depositing the metal-containing material for forming the metal-semiconductor compound elements 424, the metal-containing material is also applied (or deposited) on sidewalls and bottom surfaces of the contact openings 420" to form metal layers. The metal layers may be made of or include titanium, cobalt, ruthenium, molybdenum, nickel, tantalum, tungsten, platinum, another suitable material, or a combination thereof. In some embodiments, after the formation of the metal-semiconductor compound elements 424, the portions of the metal layers that are not react with the epitaxial structures 138 are removed. One or more etching processes may be used to remove the metal layers. The protective layers 422 may protect the dielectric layer 412 during the etching processes.

However, embodiments of the disclosure are not limited thereto. Many variations and/or modifications can be made to embodiments of the disclosure. In some other embodiments, the metal-semiconductor compound elements 424 are not formed.

As shown in FIG. 4L, conductive contacts 426 are formed in the contact openings 420", in accordance with some embodiments. In some embodiments, the conductive contacts 426 completely fill the remaining portions of the contact openings 420", as shown in FIG. 4L. In some embodiments, the conductive contacts 426 penetrate through the dielectric layer 412 and the protective caps 404'. In some embodiments, the bottoms of the conductive contacts 426 are below the topmost surfaces of the semiconductor nanostructures 104c', as shown in FIG. 4L.

In some embodiments, the protective layers 422 are formed before the formation of the metal-semiconductor compound elements 424 and the conductive contacts 426. In some embodiments, due to the protective caps 404', the protective layers 422 are prevented from reaching the epitaxial structures 138. The protective layers 422 are not positioned between the conductive contacts 426 and the epitaxial structures 138. The electrical connection between the conductive contacts 426 and the epitaxial structures 138 is significantly improved.

In some embodiments, a conductive material layer is deposited over the dielectric layer 412, the protective caps 404', and the metal-semiconductor compound elements 424 to overfill the contact openings 420". The conductive material layer may be made of or include tungsten, ruthenium, molybdenum, cobalt, titanium, tantalum, tungsten, another suitable material, or a combination thereof. The conductive material layer may be deposited using an ALD process, a CVD process, a PVD process, an electroplating process, an electrochemical plating process, another applicable process, or a combination thereof.

Afterwards, a planarization process is used to remove the conductive material layer outside of the contact openings 420", in accordance with some embodiments. As a result, the remaining portions of the conductive material layer in the contact openings 420" form the conductive contacts 426, as shown in FIG. 4L. The planarization process mentioned above may include a CMP process, a grinding process, an etching process, a dry polishing process, another applicable process, or a combination thereof. During the planarization process, the dielectric layer 412 and the protective layers 422 may also be partially removed.

Afterwards, one or more dielectric layers and one or more conductive features may be formed over the structure shown in FIG. 4L.

Figure 5:
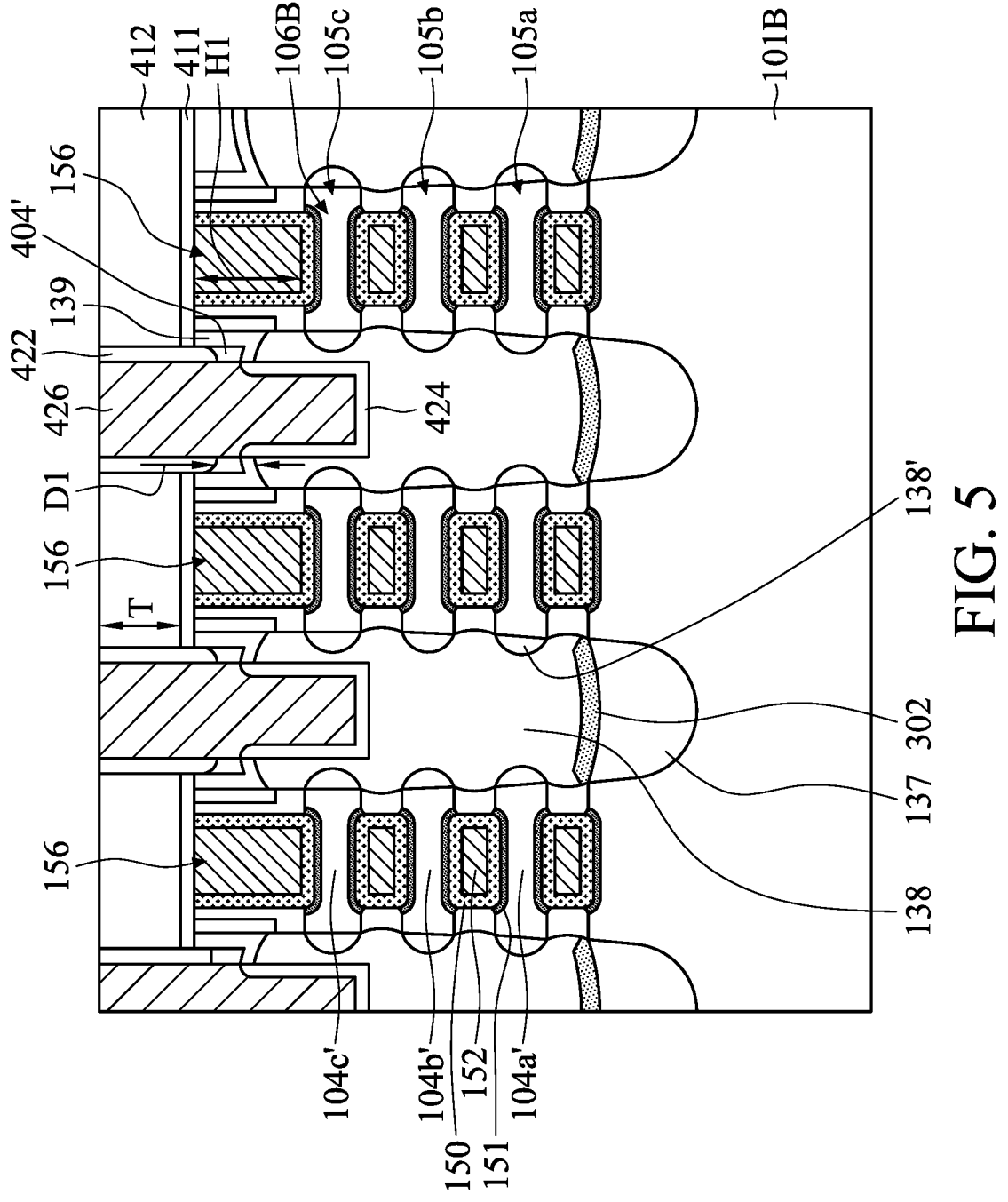
FIG. 5 is a cross-sectional view of a stage of a process for forming a portion of a semiconductor device structure, in accordance with some embodiments.
Figure 6:
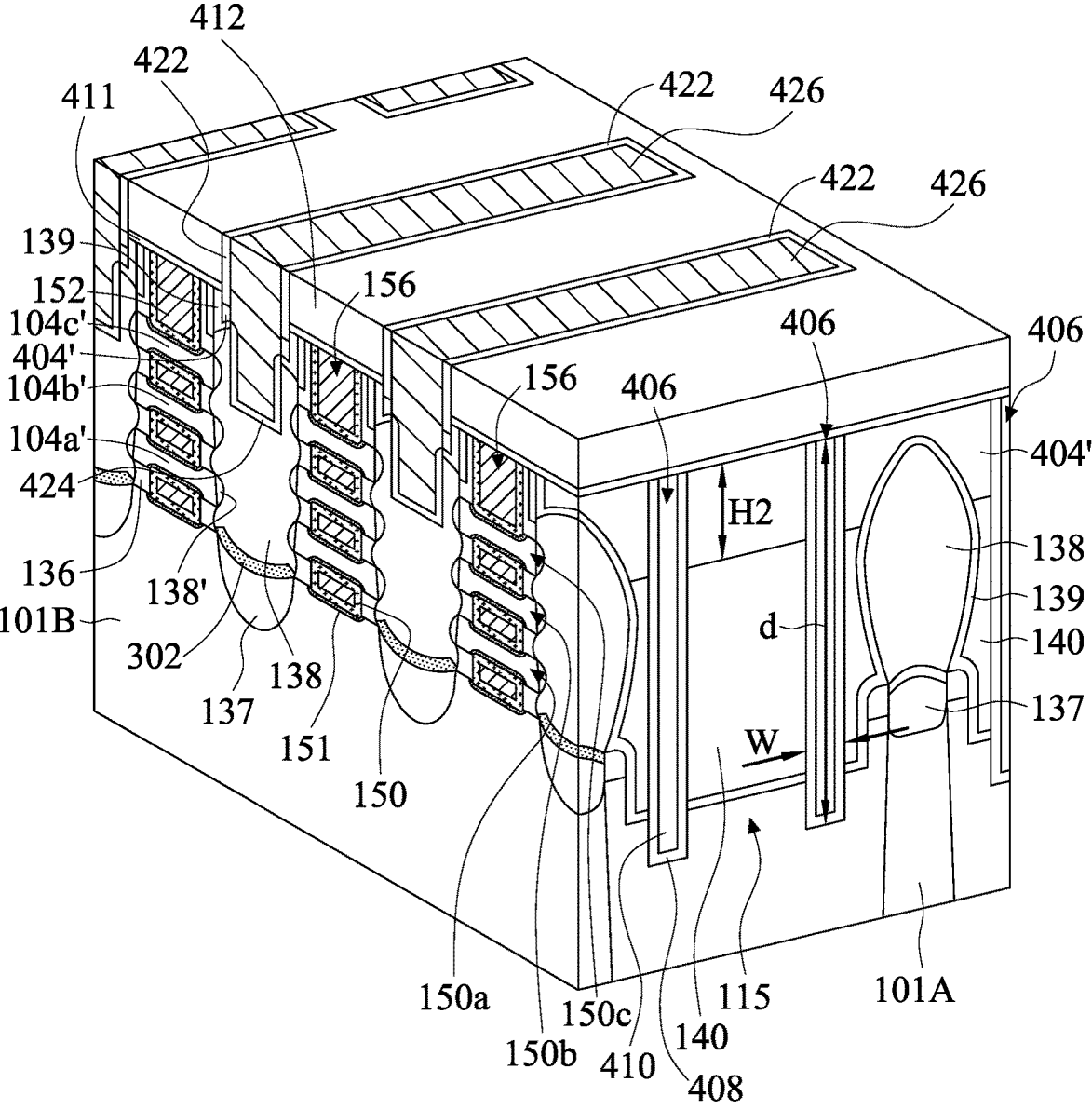
FIG. 6 is a perspective view of a stage of a process for forming a portion of a semiconductor device structure, in accordance with some embodiments.

FIG. 5 is a cross-sectional view of a stage of a process for forming a portion of a semiconductor device structure, in accordance with some embodiments. In some embodiments, FIG. 5 shows a cross-sectional view of the structure shown in FIG. 4L. FIG. 6 is a perspective view of a stage of a process for forming a portion of a semiconductor device structure, in accordance with some embodiments. In some embodiments, FIG. 6 shows a perspective view of the structure shown in FIG. 4L observed from a different view angle.

In some embodiments, the protective layers 422 are separated from the epitaxial structures 138 without being laterally surrounded by the epitaxial structures 138, as shown in FIGS. 4L, 5, and 6. As shown in FIG. 5, each of the protective layers 422 is separated from the epitaxial structure 138 thereunder by a distance D1. The distance D1 may be within a range from about 2 nm to about 8 nm. In some embodiments, each of the protective layers 422 is in direct contact with the respective protective caps 404' that is nearby. In some embodiments, each of the metal-semiconductor compound elements 424 has a length that is within a range from about 15 nm to about 30 nm.

As shown in FIG. 5, each of the metal gate stacks 156 has a height H1 measured from the top of the metal gate stack 156 to the top of the topmost semiconductor nanostructure such as the semiconductor nanostructure 104c'. The height H1 may be within a range from about 10 nm to about 20 nm. As shown in FIG. 6, each of the protective caps 404' has a height H2. The height H2 may be within a range from about 5 nm to about 14 nm. As shown in FIG. 5, the dielectric layer 412 has a thickness T. The thickness T may be within a range from about 16 nm to about 20 nm. As shown in FIG. 6, each of the dielectric structures 406 has a width W. The width W may be within a range from about 21 nm to about 33 nm. Each of the dielectric structures 406 has a depth d. The depth d may be within a range from about 110 nm to about 160 nm.

Many variations and/or modifications can be made to embodiments of the disclosure. In some embodiments, there are fin bottom isolation structures formed between the semiconductor fin and the semiconductor substrate 100. The fin bottom isolation structures may be made of or include silicon nitride, carbon-containing silicon oxynitride, carbon-containing silicon nitride, carbon-containing silicon oxide, silicon oxide, another suitable material, or a combination thereof. Each of the fin bottom isolation structures may have a thickness that is within a range from about 2 nm to about 6 nm.

Many variations and/or modifications can be made to embodiments of the disclosure. In some embodiments, there are three channel structures (such as the semiconductor nanostructures 104a'-104c') formed between the nearby epitaxial structures 138. However, embodiments of the disclosure are not limited thereto. Many variations and/or modifications can be made to embodiments of the disclosure. In some embodiments, the total number of semiconductor nanostructures between the nearby epitaxial structures 138 is greater than three. In some other embodiments, the total number of semiconductor nanostructures between the nearby epitaxial structures 138 is smaller than three. The total number of semiconductor nanostructures (or channel structures) between the nearby epitaxial structures 138 may be fine-tuned to meet requirements. For example, the total number of semiconductor nanostructures between the nearby epitaxial structures 138 may be between 2 and 10. The semiconductor nanostructures may have many applicable profiles. The semiconductor nanostructures may include nanosheets, nanowires, or other suitable nanostructures.

Embodiments of the disclosure form a semiconductor device structure with a conductive contact electrically connected to an epitaxial structure. A protective layer is formed between the conductive contact and a dielectric layer laterally surrounding the conductive contact. The conductive contact further extends into the epitaxial structure so as to increase the contact area and to reduce the resistance between the conductive contact and the epitaxial structure. The protective layer is formed before the formation of a contact opening extending into the epitaxial structure. The protective layer is thus prevented from reaching the interior sidewalls of the epitaxial structure and separating the conductive contact from the epitaxial structure. The contact area between the conductive contact and the epitaxial structure may thus remain large. The performance and reliability of the semiconductor device structure are thus improved.

In accordance with some embodiments, a method for forming a semiconductor device structure is provided. The method includes forming a metal gate stack wrapped around multiple semiconductor nanostructures. The semiconductor nanostructures are beside an epitaxial structure. The method includes forming a dielectric layer over the metal gate stack and the epitaxial structure. The method further includes forming a contact opening in the dielectric layer and forming a protective layer over sidewalls of the contact opening. In addition, the method includes deepening the contact opening so that the contact opening extends into the epitaxial structure after the formation of the protective layer. The method includes forming a conductive contact filling the contact opening.

In accordance with some embodiments, a method for forming a semiconductor device structure is provided. The method includes forming an epitaxial structure beside a channel structure and forming a protective cap over the epitaxial structure. The method also includes forming a dielectric layer over the protective cap and partially removing the dielectric layer to form a contact opening exposing the protective cap. The method further includes forming a protective layer over sidewalls of the contact opening and partially removing the protective cap and the epitaxial structure so that the contact opening is deepened. In addition, the method includes forming a conductive contact filling the contact opening.

In accordance with some embodiments, a semiconductor device structure is provided. The semiconductor device structure includes an epitaxial structure and multiple semiconductor nanostructures electrically connected to the epitaxial structure. The semiconductor device structure also includes a dielectric layer over the semiconductor nanostructures and the epitaxial structure. The semiconductor device structure further includes a conductive contact penetrating through the dielectric layer and extending into the epitaxial structure. In addition, the semiconductor device structure includes a protective layer between the dielectric layer and the conductive contact, and the protective layer is separated from the epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a metal gate stack wrapped around a plurality of semiconductor nanostructures, wherein the semiconductor nanostructures are beside an epitaxial structure;
   forming a dielectric layer over the metal gate stack and the epitaxial structure;
   forming a contact opening in the dielectric layer;
   forming a protective layer over sidewalls of the contact opening;
   deepening the contact opening so that the contact opening extends into the epitaxial structure after the formation of the protective layer; and
   forming a conductive contact filling the contact opening.

2. The method for forming a semiconductor device structure as claimed in claim 1, further comprising:
   forming a metal-semiconductor compound element on the epitaxial structure, wherein the metal-semiconductor compound element is between the conductive contact and the epitaxial structure.

3. The method for forming a semiconductor device structure as claimed in claim 1, further comprising:
   forming a protective cap over the epitaxial structure before the metal gate stack is formed, wherein a bottom of the protective cap is vertically positioned between a top of the epitaxial structure and a bottom of the epitaxial structure.

4. The method for forming a semiconductor device structure as claimed in claim 1, wherein the conductive contact is formed to have a bottom below a topmost surface of a topmost semiconductor nanostructure of the semiconductor nanostructures.

5. The method for forming a semiconductor device structure as claimed in claim 1, further comprising:
   forming a fin structure over a substrate, wherein the fin structure has a plurality of semiconductor layers and a plurality of sacrificial layers laid out in an alternating manner;
   forming a dummy gate stack extending across the fin structure;
   partially removing the fin structure to form a recess exposing side surfaces of the semiconductor layers and the sacrificial layers;
   forming the epitaxial structure in the recess; and
   forming a second dielectric layer laterally surrounding the epitaxial structure and the dummy gate stack.

6. The method for forming a semiconductor device structure as claimed in claim 5, further comprising:

recessing the second dielectric layer so that the epitaxial structure protrudes from a topmost surface of the second dielectric layer;

forming a protective material layer over the second dielectric layer, the dummy gate stack, and the epitaxial structure; and planarizing the protective material layer so that the dummy gate stack is exposed, wherein a remaining portion of the protective material layer forms a protective cap over the epitaxial structure.

7. The method for forming a semiconductor device structure as claimed in claim 6, further comprising:

removing the dummy gate stack and the sacrificial layers after the formation of the protective cap, wherein remaining portions of the semiconductor layers form the semiconductor nanostructures.

8. The method for forming a semiconductor device structure as claimed in claim 6, wherein the protective layer is separated from the epitaxial structure by the protective cap.

9. The method for forming a semiconductor device structure as claimed in claim 6, wherein the protective layer is formed to be in direct contact with the protective cap.

10. The method for forming a semiconductor device structure as claimed in claim 1, wherein the protective layer is substantially free of oxygen.

11. A method for forming a semiconductor device structure, comprising:

forming an epitaxial structure beside a channel structure;

forming a protective cap over the epitaxial structure;

forming a dielectric layer over the protective cap;

partially removing the dielectric layer to form a contact opening exposing the protective cap;

forming a protective layer over sidewalls of the contact opening;

partially removing the protective cap and the epitaxial structure so that the contact opening is deepened; and forming a conductive contact filling the contact opening.

12. The method for forming a semiconductor device structure as claimed in claim 11, wherein the protective layer is formed before the contact opening is deepened.

13. The method for forming a semiconductor device structure as claimed in claim 11, further comprising:

forming a metal-semiconductor compound element on the epitaxial structure, wherein the metal-semiconductor compound element is between the conductive contact and the epitaxial structure.

14. The method for forming a semiconductor device structure as claimed in claim 13, wherein the metal-semiconductor compound element is formed before the conductive contact is formed.

15. The method for forming a semiconductor device structure as claimed in claim 11, further comprising:

forming a gate stack extending across the channel structure; and forming a dielectric structure separating the gate stack into two separated portions, wherein the dielectric structure penetrates through the protective cap.

16. A method for forming a semiconductor device structure, comprising:

forming an epitaxial structure beside a channel structure;

forming a dielectric layer over the epitaxial structure;

forming a contact opening in the dielectric layer, wherein the contact opening extends toward the epitaxial structure;

forming a protective layer over sidewalls of the contact opening;

deepening the contact opening into the epitaxial structure; and forming a conductive contact over the epitaxial structure, wherein the conductive contact at least partially fills the contact opening.

17. The method for forming a semiconductor device structure as claimed in claim 16, wherein after the deepening of the contact opening, the contact opening extends downward past a top of the channel structure.

18. The method for forming a semiconductor device structure as claimed in claim 17, wherein after the deepening of the contact opening, the contact opening extends downward past a bottom of the channel structure.

19. The method for forming a semiconductor device structure as claimed in claim 16, wherein after the deepening of the contact opening, an upper portion of the contact opening in the dielectric layer is wider than a lower portion of the contact opening in the epitaxial structure.

20. The method for forming a semiconductor device structure as claimed in claim 19, further comprising:

forming a metal-semiconductor composite layer extending along a sidewall and a bottom of the lower portion of the contact opening in the epitaxial structure before the conductive contact is formed.

* * * * *